US009500356B2

(12) United States Patent
Yang

(10) Patent No.: US 9,500,356 B2
(45) Date of Patent: Nov. 22, 2016

(54) HEAT DISSIPATER WITH AXIAL AND RADIAL AIR APERTURE AND APPLICATION DEVICE THEREOF

(76) Inventor: Tai-Her Yang, Dzan-Hwa (TW)

( * ) Notice: Subject to any disclaimer, the term of this patent is extended or adjusted under 35 U.S.C. 154(b) by 339 days.

(21) Appl. No.: 13/354,401

(22) Filed: Jan. 20, 2012

(65) Prior Publication Data

US 2013/0175915 A1 Jul. 11, 2013

Related U.S. Application Data

(63) Continuation-in-part of application No. 13/345,848, filed on Jan. 9, 2012, now Pat. No. 8,931,925.

(51) Int. Cl.

| | |
|---|---|
| ***H05K 7/20*** | (2006.01) |
| ***F21V 29/75*** | (2015.01) |
| ***F21V 29/00*** | (2015.01) |
| ***F21K 99/00*** | (2016.01) |
| ***F21V 29/67*** | (2015.01) |
| ***F21V 29/83*** | (2015.01) |
| *F21Y 101/02* | (2006.01) |
| *F21Y 103/02* | (2006.01) |

(52) U.S. Cl.

CPC ................. *F21V 29/75* (2015.01); *F21K 9/00* (2013.01); *F21V 29/004* (2013.01); *F21V 29/673* (2015.01); *F21V 29/83* (2015.01); *F21Y 2101/02* (2013.01); *F21Y 2103/022* (2013.01)

(58) Field of Classification Search

None

See application file for complete search history.

(56) References Cited

U.S. PATENT DOCUMENTS

| | | | | |
|---|---|---|---|---|
| 4,503,360 | A * | 3/1985 | Bedel | 362/373 |
| 6,793,374 | B2 * | 9/2004 | Begemann | 362/294 |
| 7,575,346 | B1 * | 8/2009 | Horng et al. | 362/373 |
| 8,066,414 | B2 * | 11/2011 | Pabst et al. | 362/373 |
| 8,143,769 | B2 * | 3/2012 | Li | 313/46 |
| 2006/0193139 | A1 * | 8/2006 | Sun et al. | 362/373 |
| 2006/0290891 | A1 * | 12/2006 | Wang et al. | 353/52 |
| 2007/0279862 | A1 * | 12/2007 | Li | 361/692 |
| 2008/0049399 | A1 * | 2/2008 | Lu | F21K 9/137 361/714 |
| 2008/0212333 | A1 * | 9/2008 | Chen | 362/373 |
| 2010/0060130 | A1 * | 3/2010 | Li | 313/46 |

* cited by examiner

*Primary Examiner* — Britt D Hanley

(74) *Attorney, Agent, or Firm* — Bacon & Thomas, PLLC

(57) ABSTRACT

The present invention is characterized in that the heat generated by the electric illumination device cannot only be dissipated to the exterior through the surface of the heat dissipater, but also enabled to be further dissipated by the air flowing capable of assisting heat dissipation through the hot airflow in a heat dissipater (101) with axial and radial air aperture generating a hot ascent/cold descent effect for introducing airflow from an air inlet port formed near a light projection side to pass an axial tubular flowpath (102) then be discharged from a radial air outlet hole (107) formed near a connection side (104) of the heat dissipater (101) with axial and radial air aperture.

17 Claims, 18 Drawing Sheets

HEAT DISSIPATER WITH AXIAL AND RADIAL AIR APERTURE AND APPLICATION DEVICE THEREOF

CROSS-REFERENCE TO RELATED APPLICATION

This application is a Continuation-In-Part of my patent application, Ser. No. 13/345,848, filed on Jan. 9, 2012 now U.S. Pat. No. 8,931,925.

BACKGROUND OF THE INVENTION (a) Field of the Invention

The present invention provides an electric luminous body having a heat dissipater with axial and radial air apertures for meeting the heat dissipation requirement of an electric illumination device, e.g. utilizing a light emitting diode (LED) as an electric luminous body, so the heat generated by the electric illumination device cannot only be dissipated to the exterior through the surface of the heat dissipater, but also enabled to be further dissipated by the air flowing capable of assisting heat dissipation through the hot airflow in a heat dissipater (101) with axial and radial air apertures generating a hot ascent/cold descent effect for introducing airflow from an air inlet port formed near a light projection side to pass an axial tubular flowpath (102) then be discharged from a radial air outlet hole (107) formed near a connection side (104) of the heat dissipater (101) with axial and radial air apertures.

(b) Description of the Prior Art

A conventional heat dissipation device used in an electric luminous body of an electric illumination device, e.g. a heat dissipater of a LED illumination device, generally transmits heat generated by the LED to the heat dissipater for discharging the heat to the exterior through the surface of the heat dissipater, and said conventional heat dissipater is not equipped with functions of utilizing the airflow introduced from an air inlet port to pass an inner heat dissipation surface formed by an axial hole then discharged by a radial air outlet for the purpose of increasing the effect of externally dissipating heat from the interior of the heat dissipater. The present invention is provided with a heat dissipater (101) with axial and radial air apertures in which an axial tubular flowpath (102) is formed for structuring an axial hole, so heat generated by an electric luminous body installed at a light projection side (103) of the heat dissipater (101) with axial and radial air apertures cannot only be dissipated to the exterior through the surface of the heat dissipater, but also enabled to be further dissipated by the air flowing capable of assisting the heat being dissipated from the interior of the heat dissipater to the exterior through the hot airflow in the heat dissipater (101) with axial and radial air apertures generating a hot ascent/cold descent effect for introducing airflow from an air inlet port of the axial hole structured by the axial tubular flowpath (102) and formed near a light projection side then be discharged from a radial air outlet hole (107) formed near a connection side (104) of the heat dissipater (101) with axial and radial air apertures.

SUMMARY OF THE INVENTION

A conventional heat dissipation device used in an electric luminous body of an electric illumination device, e.g. a heat dissipater of a LED illumination device, generally transmits heat generated by the LED to the heat dissipater for discharging the heat to the exterior through the surface of the heat dissipater, and said conventional heat dissipater is not equipped with functions of utilizing the airflow introduced from an air inlet port to pass an inner heat dissipation surface formed by an axial hole then discharged by a radial air outlet for the purpose of increasing the effect of externally dissipating heat from the interior of the heat dissipater. The present invention provides an electric luminous body having a heat dissipater with axial and radial air apertures for meeting the heat dissipation requirement of an electric illumination device, e.g. utilizing a light emitting diode (LED) as an electric luminous body, the interior of the heat dissipater (101) with axial and radial air apertures is formed with an axial tubular flowpath (102) for structuring an axial hole, so heat generated by an electric luminous body installed at a light projection side (103) of the heat dissipater (101) with axial and radial air apertures cannot only be dissipated to the exterior through the surface of the heat dissipater, but also enabled to be further dissipated by the air flowing capable of assisting the heat being dissipated from the interior of the heat dissipater to the exterior through the hot airflow in the heat dissipater (101) with axial and radial air apertures generating a hot ascent/cold descent effect for introducing airflow from an air inlet port of the axial hole structured by the axial tubular flowpath (102) and formed near a light projection side then be discharged from a radial air outlet hole (107) formed near a connection side (104) of the heat dissipater (101) with axial and radial air apertures, thereby assisting the hot airflow inside the heat dissipater (101) with axial and radial air apertures to be dissipated to the exterior.

Figure 1:
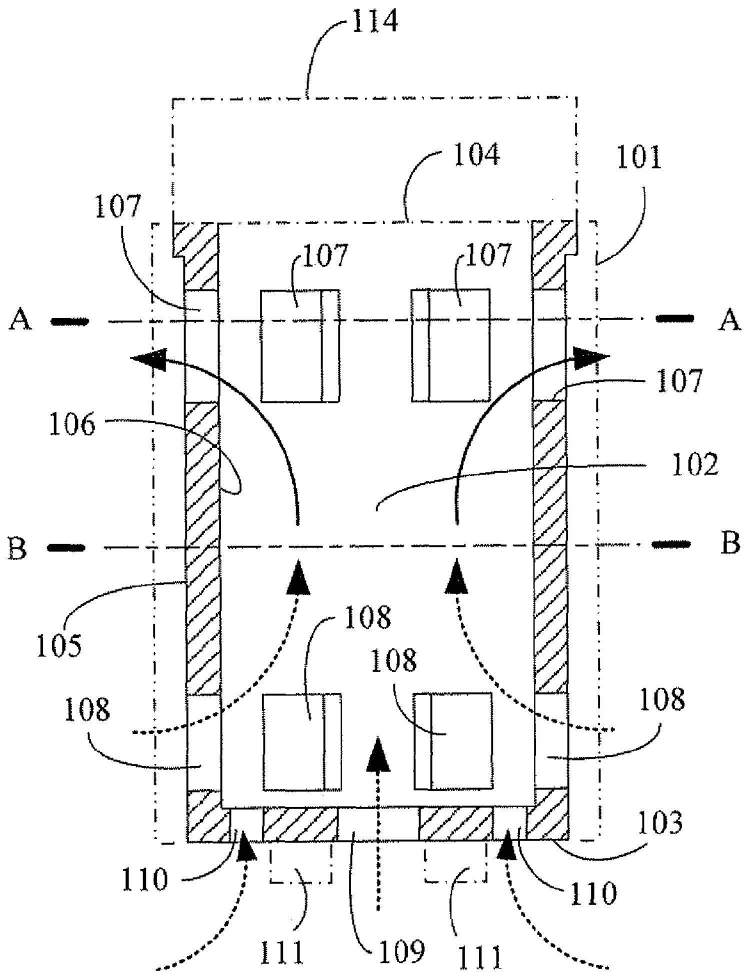
FIG. 1 is a schematic view showing the basic structure and operation of the present invention.

DESCRIPTION OF MAIN COMPONENT SYMBOLS (101): heat dissipater with axial and radial air aperture
(102): axial tubular flowpath
(103): light projection side
(104): connection side
(105): external heat dissipation surface
(106): internal heat dissipation surface
(107): radial air outlet hole
(108): radial air inlet port
(109): central axial air inlet port
(110): air inlet port annularly arranged near the periphery of axial end
surface
(111): light emitting diode
(112): secondary optical device
(113): light-pervious lampshade
(114): axially-fixed and electric-conductive interface
(115): radially-fixed and electric-conductive interface
(116): top cover member
(200): heat dissipation fin structure
(301), (302): flow guide conical member
(400): electric motor driven fan

DETAILED DESCRIPTION OF THE PREFERRED EMBODIMENTS

A conventional heat dissipation device used in an electric luminous body of an electric illumination device, e.g. a heat dissipater of a LED illumination device, generally transmits heat generated by the LED to the heat dissipater for discharging the heat to the exterior through the surface of the heat dissipater, and said conventional heat dissipater is not equipped with functions of utilizing the airflow introduced from an air inlet port to pass an inner heat dissipation surface formed by an axial hole then discharged by a radial air outlet for the purpose of increasing the effect of externally dissipating heat from the interior of the heat dissipater. The present invention is provided with a heat dissipater (101) with axial and radial air apertures in which an axial tubular flowpath (102) is formed for structuring an axial hole, so heat generated by an electric luminous body installed at a light projection side (103) of the heat dissipater (101) with axial and radial air apertures cannot only be dissipated to the exterior through the surface of the heat dissipater, but also enabled to be further dissipated by the air flowing capable of assisting the heat being dissipated from the interior of the heat dissipater to the exterior through the hot airflow in the heat dissipater (101) with axial and radial air apertures generating a hot ascent/cold descent effect for introducing airflow from an air inlet port of the axial hole structured by the axial tubular flowpath (102) and formed near a light projection side then be discharged from a radial air outlet hole (107) formed near a connection side (104) of the heat dissipater (101) with axial and radial air apertures.

The present invention provides an heat dissipater with axial and radial air aperture and application device thereof-electric luminous body having a heat dissipater with axial and radial air apertures for meeting the heat dissipation requirement of an electric illumination device, e.g. utilizing a light emitting diode (LED) as an electric luminous body, so the heat generated by the electric illumination device cannot only be dissipated to the exterior through the surface of the heat dissipater, but also enabled to be further dissipated by the air flowing capable of assisting heat dissipation through the hot airflow in a heat dissipater (101) with axial and radial air apertures generating a hot ascent/cold descent effect for introducing airflow from an air inlet port formed near a light projection side to pass an axial tubular flowpath (102) then be discharged from a radial air outlet hole (107) formed near a connection side (104) of the heat dissipater (101) with axial and radial air apertures.

Figure 2:
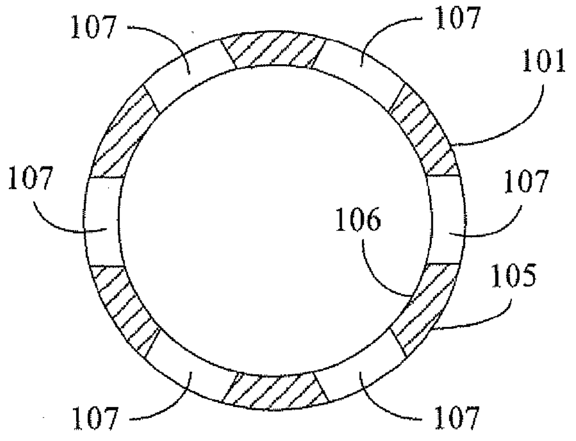
FIG. 2 is a cross sectional view of FIG. 1 taken from A-A cross section.

FIG. 1 is a schematic view showing the basic structure and operation of the present invention;

FIG. 2 is a cross sectional view of FIG. 1 taken from A-A cross section;

As shown in FIG. 1 and FIG. 2, it mainly consists of:

heat dissipater (101) with axial and radial air apertures: made of a material having good heat conductivity and formed as an integral or assembled hollow member, the outer radial surface is formed as a smooth surface, rib surface, grid surface, porous, net-shaped or fin-shaped structure, thereby forming an external heat dissipation surface (105); the radial interior is formed as a smooth surface, rib surface, grid surface, porous, net-shaped or fin-shaped structure, thereby forming an internal heat dissipation surface (106); the center is provided with an axial tubular flowpath (102) to constitute an axial hole allowing airflow to pass, and one axial side of the heat dissipater (101) with axial and radial air apertures is defined as a light projection side (103) allowing an electric luminous body to be installed thereon, and the other axial side is formed in a sealed or semi-sealed or opened structure for serving as a connection side (104) to be served as the external connecting structure;

one end of the heat dissipater (101) with axial and radial air aperture near the connection side (104) is installed with one or more than one radial air outlet holes (107), and the light projection side (103) is installed with one or more than one air inlet ports, said air inlet ports are installed to at least one or more than one of three locations which include the outer periphery being installed with a radial air inlet port (108) and/or the center of axial end surface of the light projection side (103) being installed with a central axial air inlet port (109) and/or the light projection side (103) being installed with an air inlet port (110) annularly arranged near the periphery of axial end surface;

With the mentioned structure when generating heat loss during the electric luminous body being electrically conducted for emitting light, the air flowing formed through the hot airflow in the heat dissipater (101) with axial and radial air aperture generating a hot ascent/cold descent effect for introducing airflow from the air inlet port formed near the light projection side to pass the axial hole configured by the axial tubular flowpath (102) then be discharged from the radial air outlet hole (107) formed near the connection side (104) of the heat dissipater (101) with axial and radial air aperture, thereby discharging thermal energy in the axial tubular flowpath (102) to the exterior.

Figure 3:
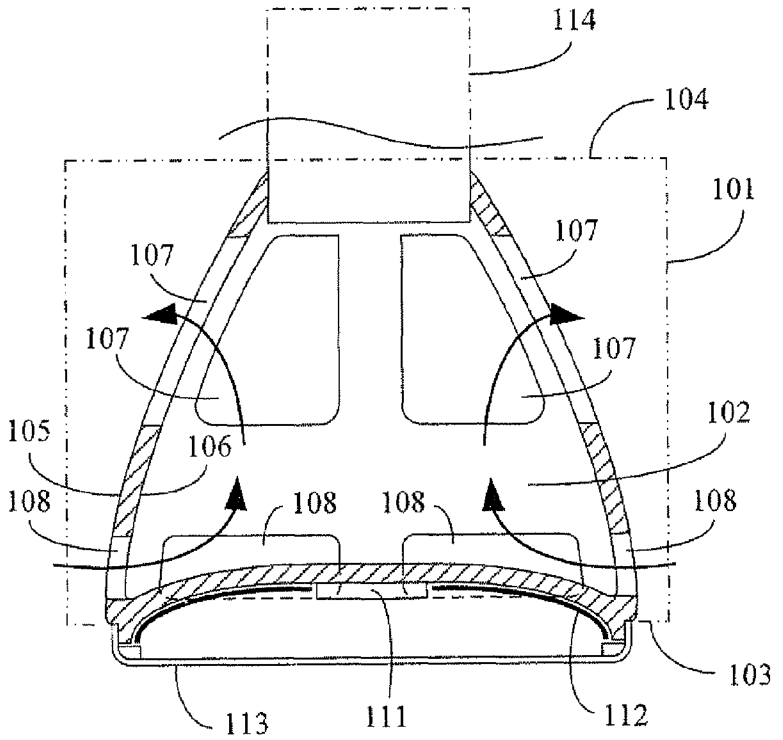
FIG. 3 is a schematic structural view illustrating an electric luminous body being installed at the center of the end surface of a light projection side of the heat dissipater (101) with axial and radial air apertures, and a radial air inlet port (108) being formed near the outer periphery of the light projection side, according to one embodiment of the present invention.
Figure 4:
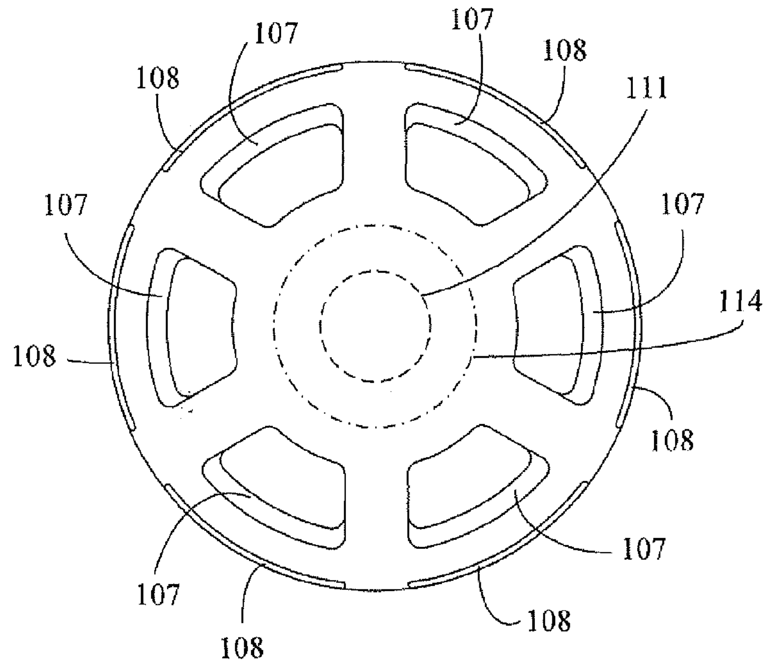
FIG. 4 is a top view of FIG. 3.

FIG. 3 is a schematic structural view illustrating an electric luminous body being installed at the center of the end surface of a light projection side of the heat dissipater (101) with axial and radial air apertures, and a radial air inlet port (108) being formed near the outer periphery of the light projection side, according to one embodiment of the present invention;

FIG. 4 is a top view of FIG. 3;

As shown in FIG. 3 and FIG. 4, it mainly consists of:

heat dissipater (101) with axial and radial air apertures: made of a material having good heat conductivity and formed as an integral or assembled hollow member, the outer radial surface is formed as a smooth surface, rib surface, grid surface, porous, net-shaped or fin-shaped structure, thereby forming an external heat dissipation surface (105); the radial interior is formed as a smooth surface, rib surface, grid surface, porous, net-shaped or fin-shaped structure, thereby forming an internal heat dissipation surface (106); the center is provided with an axial tubular flowpath (102) to constitute an axial hole allowing airflow to pass, and one axial side of the heat dissipater (101) with axial and radial air apertures is defined as a light projection side (103) allowing an electric luminous body to be installed thereon, and the other axial side is formed in a sealed or semi-sealed or opened structure for serving as a connection side (104) to be served as the external connecting structure;

one end of the heat dissipater (101) with axial and radial air aperture near the connection side (104) is installed with one or more than one radial air outlet holes (107), and said radial air outlet hole (107) includes grid holes configured by a hole-shaped or net-shaped structure;

radial air inlet port (108): constituted by one or more than one radial air inlet ports (108) installed near the outer periphery of the light projection side (103) of the heat dissipater (101) with axial and radial air aperture, and said radial air inlet port (108) includes grid holes configured by a hole-shaped or net-shaped structure;

With the mentioned structure when generating heat loss during the electric luminous body being electrically conducted for emitting light, the air flowing formed through the hot airflow in the heat dissipater (101) with axial and radial air aperture generating a hot ascent/cold descent effect for introducing airflow from one or more than one radial air inlet ports (108) of the light projection side (103) to pass the axial hole configured by the axial tubular flowpath (102) then be discharged from the radial air outlet hole (107) formed near the connection side (104) of the heat dissipater (101) with axial and radial air aperture, thereby discharging thermal energy in the axial tubular flowpath (102) to the exterior;

electric luminous body: constituted by one or more than one devices capable of being inputted with electric power for generating optical power, e.g. a LED (111) or LED module, installed at the center of the light projection side (103) of the heat dissipater (101) with axial and radial air apertures for projecting light to the exterior according to a set direction;

secondary optical device (112): optionally installed, provided with functions of condensing, diffusing, refracting or reflecting the optical energy of the LED (111) for projecting light to the exterior;

light-pervious lampshade (113): made of a light-pervious material, covering the LED (111) for the purpose of protecting the LED (111), and allowing the optical energy of LED (111) passing through for projecting to the exterior;

axially-fixed and electric-conductive interface (114): one end thereof is connected to the connection side (104) of the heat dissipater (101) with axial and radial air aperture, the other end is a screw-in type, insertion type or lock-on type lamp head or lamp holder structure, or an electric conductive interface structure configured by an electric conductive terminal structure, provided as a connection interface for the electric luminous body and an axial external electric power, and connected to the electric luminous body with an electric conductive member for transmitting electric power.

Figure 5:
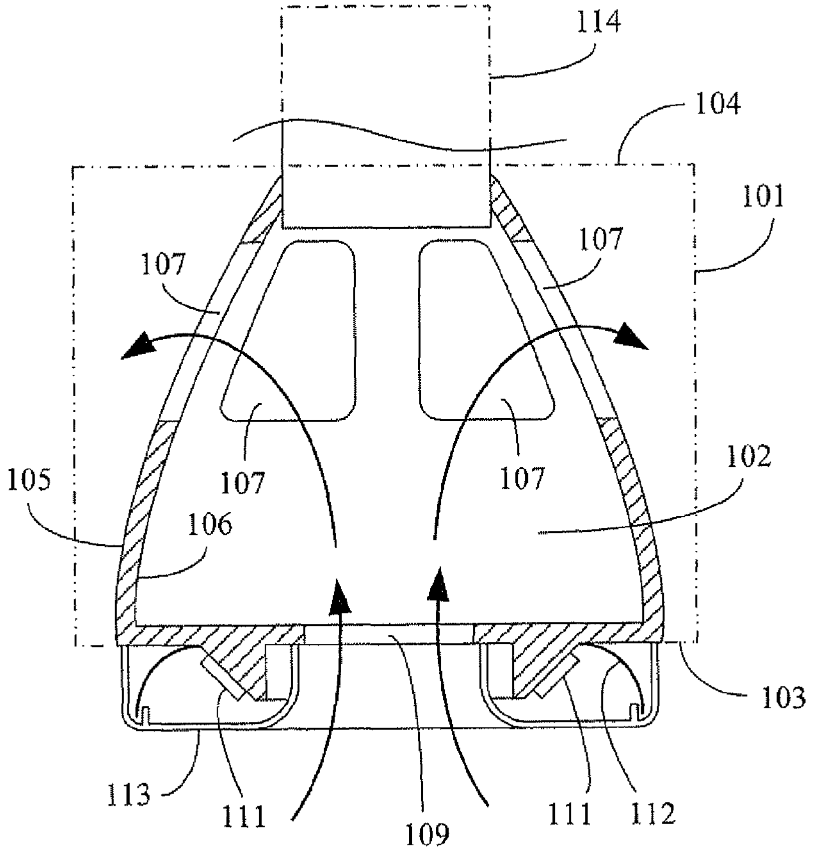
FIG. 5 is a schematic structural view illustrating the electric luminous body being annularly installed near the outer periphery of the light projection side of the heat dissipater (101) with axial and radial air apertures, and being formed with a central axial air inlet port (109), according to one embodiment of the present invention.
Figure 6:
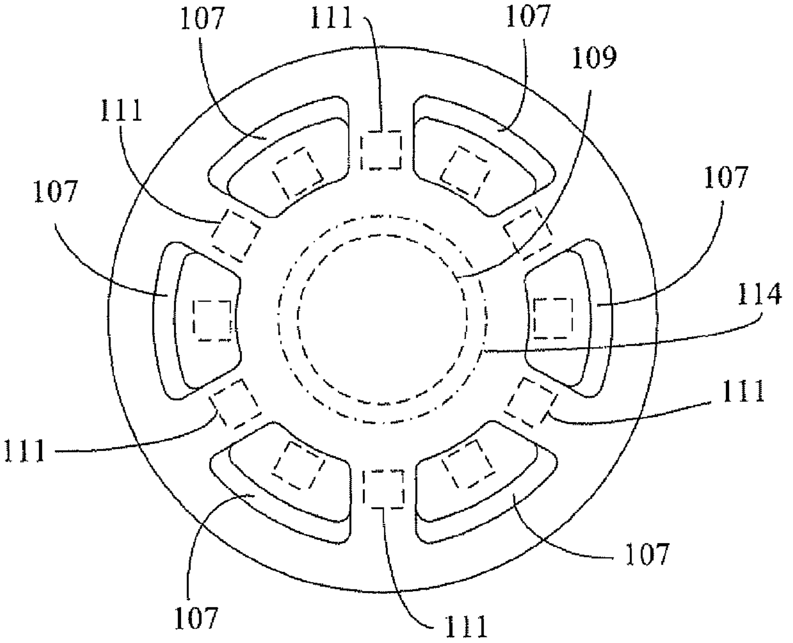
FIG. 6 is a top view of FIG. 5.

FIG. 5 is a schematic structural view illustrating the electric luminous body being annularly installed near the outer periphery of the light projection side of the heat dissipater (101) with axial and radial air apertures, and being formed with a central axial air inlet port (109), according to one embodiment of the present invention;

FIG. 6 is a top view of FIG. 5;

As shown in FIG. 5 and FIG. 6, it mainly consists of:

heat dissipater (101) with axial and radial air apertures: made of a material having good heat conductivity and formed as an integral or assembled hollow member, the outer radial surface is formed as a smooth surface, rib surface, grid surface, porous, net-shaped or fin-shaped structure, thereby forming an external heat dissipation surface (105); the radial interior is formed as a smooth surface, rib surface, grid surface, porous, net-shaped or fin-shaped structure, thereby forming an internal heat dissipation surface (106); the center is provided with an axial tubular flowpath (102) to constitute an axial hole allowing airflow to pass, and one axial side of the heat dissipater (101) with axial and radial air apertures is defined as a light projection side (103) allowing an electric luminous body to be installed thereon, and the other axial side is formed in a sealed or semi-sealed or opened structure for serving as a connection side (104) to be served as the external connecting structure;

one end of the heat dissipater (101) with axial and radial air aperture near the connection side (104) is installed with one or more than one radial air outlet holes (107), and said radial air outlet hole (107) includes grid holes configured by a hole-shaped or net-shaped structure;

central axial air inlet port (109): constituted by a central axial air inlet port structure installed on the axial end surface of the light projection side (103) of the heat dissipater (101) with axial and radial air aperture for communicating to the axial tubular flowpath (102), and said central axial air inlet port (109) includes grid holes configured by a hole-shaped or net-shaped structure;

With the mentioned structure when generating heat loss during the electric luminous body being electrically conducted for emitting light, the air flowing formed through the hot airflow in the heat dissipater (101) with axial and radial air aperture generating a hot ascent/cold descent effect for introducing airflow from the central axial air inlet port (109) of the light projection side (103) to pass the axial hole configured by the axial tubular flowpath (102) then be discharged from the radial air outlet hole (107) formed near the connection side (104) of the heat dissipater (101) with axial and radial air aperture, thereby discharging thermal energy in the axial tubular flowpath (102) to the exterior;

electric luminous body: constituted by one or more than one devices capable of being inputted with electric power for generating optical power, e.g. a LED (111) or LED module, installed at the outer of the light projection side (103) of the heat dissipater (101) with axial and radial air apertures for projecting light to the exterior according to a set direction;

secondary optical device (112): optionally installed, provided with functions of condensing, diffusing, refracting or reflecting the optical energy of the LED (111) for projecting light to the exterior;

light-pervious lampshade (113): made of a light-pervious material, covering the LED (111) for the purpose of protecting the LED (111), and allowing the optical energy of LED (111) passing through for projecting to the exterior;

axially-fixed and electric-conductive interface (114): one end thereof is connected to the connection side (104) of the heat dissipater (101) with axial and radial air aperture, the other end is a screw-in type, insertion type or lock-on type lamp head or lamp holder structure, or an electric conductive interface structure configured by an electric conductive terminal structure, provided as a connection interface for the electric luminous body and an axial external electric power, and connected to the electric luminous body with an electric conductive member for transmitting electric power.

Figure 7:
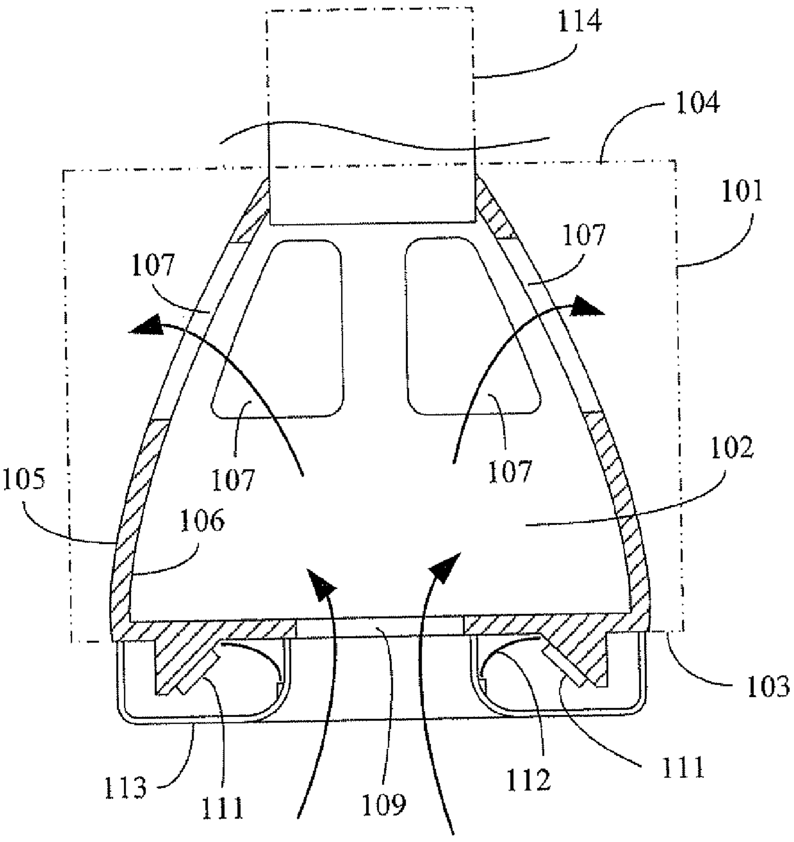
FIG. 7 is a schematic structural view illustrating the electric luminous body being annularly installed near the inner periphery of the light projection side of the heat dissipater (101) with axial and radial air apertures, and being formed with a central axial air inlet port (109), according to one embodiment of the present invention.
Figure 8:
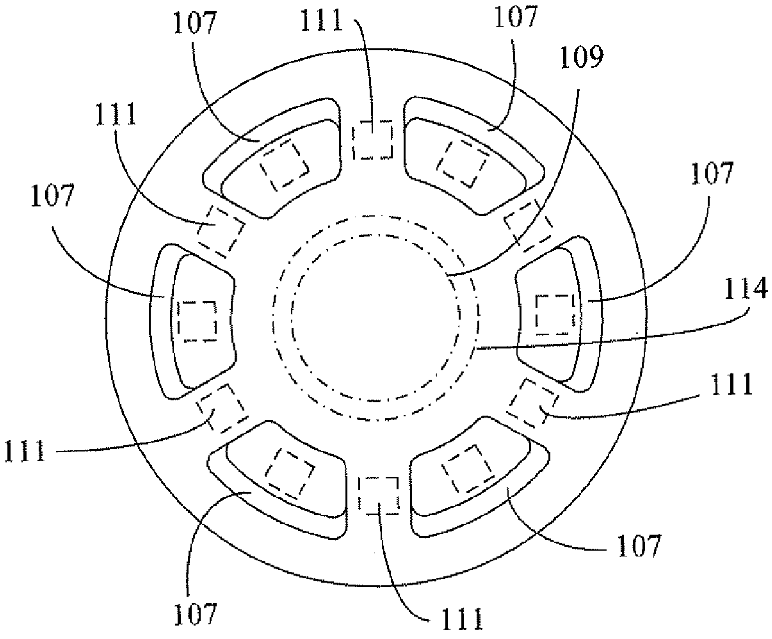
FIG. 8 is a top view of FIG. 7.

FIG. 7 is a schematic structural view illustrating the electric luminous body being annularly installed near the inner periphery of the light projection side of the heat dissipater (101) with axial and radial air apertures, and being formed with a central axial air inlet port (109), according to one embodiment of the present invention;

FIG. 8 is a top view of FIG. 7;

As shown in FIG. 7 and FIG. 8, it mainly consists of:

heat dissipater (101) with axial and radial air apertures: made of a material having good heat conductivity and formed as an integral or assembled hollow member, the outer radial surface is formed as a smooth surface, rib surface, grid surface, porous, net-shaped or fin-shaped structure, thereby forming an external heat dissipation surface (105); the radial interior is formed as a smooth surface, rib surface, grid surface, porous, net-shaped or fin-shaped structure, thereby forming an internal heat dissipation surface (106); the center is provided with an axial tubular flowpath (102) to constitute an axial hole allowing airflow to pass, and one axial side of the heat dissipater (101) with axial and radial air apertures is defined as a light projection side (103) allowing an electric luminous body to be installed thereon, and the other axial side is formed in a sealed or semi-sealed or opened structure for serving as a connection side (104) to be served as the external connecting structure;

one end of the heat dissipater (101) with axial and radial air aperture near the connection side (104) is installed with one or more than one radial air outlet holes (107), and said radial air outlet hole (107) includes grid holes configured by a hole-shaped or net-shaped structure;

central axial air inlet port (109): constituted by a central axial air inlet port structure installed on the axial end surface of the light projection side (103) of the heat dissipater (101) with axial and radial air aperture for communicating to the axial tubular flowpath (102), and said central axial air inlet port (109) includes grid holes configured by a hole-shaped or net-shaped structure;

With the mentioned structure when generating heat loss during the electric luminous body being electrically conducted for emitting light, the air flowing formed through the hot airflow in the heat dissipater (101) with axial and radial air aperture generating a hot ascent/cold descent effect for introducing airflow from the central axial air inlet port (109) of the light projection side (103) to pass the axial hole configured by the axial tubular flowpath (102) then be discharged from the radial air outlet hole (107) formed near the connection side (104) of the heat dissipater (101) with axial and radial air aperture, thereby discharging thermal energy in the axial tubular flowpath (102) to the exterior;

electric luminous body: constituted by one or more than one devices capable of being inputted with electric power for generating optical power, e.g. a LED (111) or LED module, installed at the inner of the light projection side (103) of the heat dissipater (101) with axial and radial air apertures for projecting light to the exterior according to a set direction;

secondary optical device (112): optionally installed, provided with functions of condensing, diffusing, refracting or reflecting the optical energy of the LED (111) for projecting light to the exterior;

light-pervious lampshade (113): made of a light-pervious material, covering the LED (111) for the purpose of protecting the LED (111), and allowing the optical energy of LED (111) passing through for projecting to the exterior;

axially-fixed and electric-conductive interface (114): one end thereof is connected to the connection side (104) of the heat dissipater (101) with axial and radial air aperture, the other end is a screw-in type, insertion type or lock-on type lamp head or lamp holder structure, or an electric conductive interface structure configured by an electric conductive terminal structure, provided as a connection interface for the electric luminous body and an axial external electric power, and connected to the electric luminous body with an electric conductive member for transmitting electric power.

Figure 9:
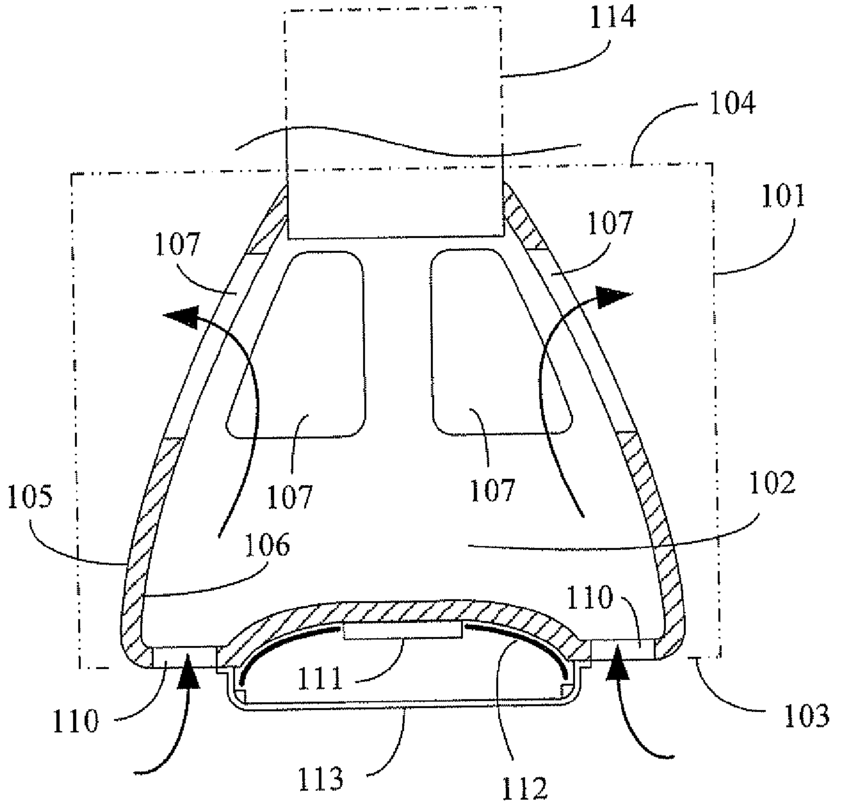
FIG. 9 is a schematic structural view illustrating the electric luminous body being installed at the center of the end surface of the light projection side of the heat dissipater (101) with axial and radial air apertures, and the light projection side being formed with an air inlet port (110) annularly arranged near the periphery of axial end surface, according to one embodiment of the present invention.
Figure 10:
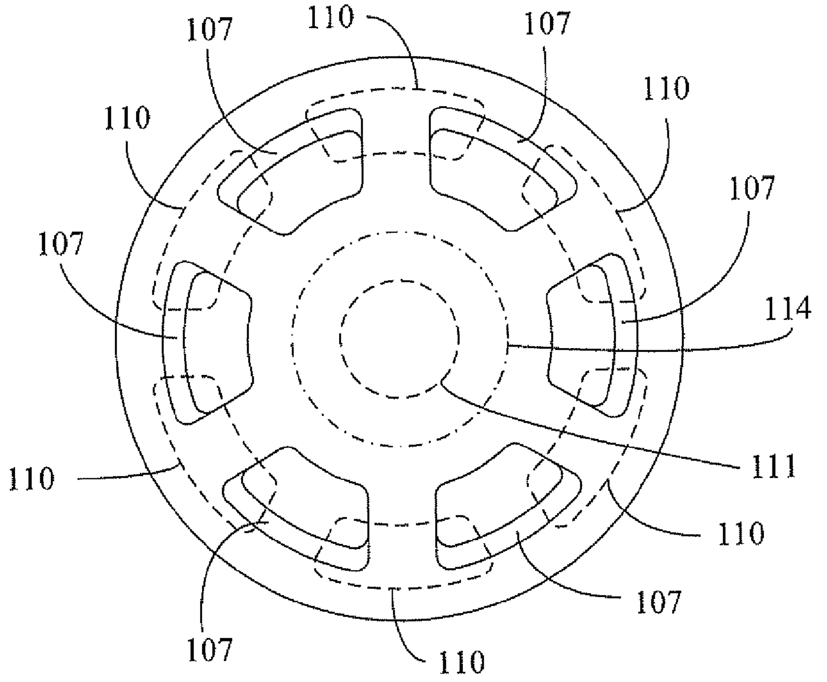
FIG. 10 is a top view of FIG. 9.

FIG. 9 is a schematic structural view illustrating the electric luminous body being installed at the center of the end surface of the light projection side of the heat dissipater (101) with axial and radial air apertures, and the light projection side being formed with an air inlet port (110) annularly arranged near the periphery of axial end surface, according to one embodiment of the present invention;

FIG. 10 is a top view of FIG. 9;

As shown in FIG. 9 and FIG. 10, it mainly consists of:

heat dissipater (101) with axial and radial air apertures: made of a material having good heat conductivity and formed as an integral or assembled hollow member, the outer radial surface is formed as a smooth surface, rib surface, grid surface, porous, net-shaped or fin-shaped structure, thereby forming an external heat dissipation surface (105); the radial interior is formed as a smooth surface, rib surface, grid surface, porous, net-shaped or fin-shaped structure, thereby forming an internal heat dissipation surface (106); the center is provided with an axial tubular flowpath (102) to constitute an axial hole allowing airflow to pass, and one axial side of the heat dissipater (101) with axial and radial air apertures is defined as a light projection side (103) allowing an electric luminous body to be installed thereon, and the other axial side is formed in a sealed or semi-sealed or opened structure for serving as a connection side (104) to be served as the external connecting structure;

one end of the heat dissipater (101) with axial and radial air aperture near the connection side (104) is installed with one or more than one radial air outlet holes (107), and said radial air outlet hole (107) includes grid holes configured by a hole-shaped or net-shaped structure;

air inlet port (110) annularly arranged near the periphery of axial end surface: constituted by one or more than one air inlet port structures annularly installed near the periphery of axial end surface of the light projection side (103) of the heat dissipater (101) with axial and radial air aperture for communicating to the axial tubular flowpath (102), and said air inlet port (110) annularly arranged near the periphery of axial end surface includes grid holes configured by a hole-shaped or net-shaped structure;

With the mentioned structure when generating heat loss during the electric luminous body being electrically conducted for emitting light, the hot airflow in the heat dissipater (101) with axial and radial air aperture generating a hot ascent/cold descent effect for introducing airflow from one or more than one air inlet port (110) annularly arranged near the periphery of axial end surface at the light projection side (103) to pass the axial hole configured by the axial tubular flowpath (102) then be discharged from the radial air outlet hole (107) formed near the connection side (104) of the heat dissipater (101) with axial and radial air aperture, thereby discharging thermal energy in the axial tubular flowpath (102) to the exterior;

electric luminous body: constituted by one or more than one devices capable of being inputted with electric power for generating optical power, e.g. a LED (111) or LED module, installed at the center of the light projection side (103) of the heat dissipater (101) with axial and radial air apertures for projecting light to the exterior according to a set direction;

secondary optical device (112): optionally installed, provided with functions of condensing, diffusing, refracting or reflecting the optical energy of the LED (111) for projecting light to the exterior;

light-pervious lampshade (113): made of a light-pervious material, covering the LED (111) for the purpose of protecting the LED (111), and allowing the optical energy of LED (111) passing through for projecting to the exterior;

axially-fixed and electric-conductive interface (114): one end thereof is connected to the connection side (104) of the heat dissipater (101) with axial and radial air aperture, the other end is a screw-in type, insertion type or lock-on type lamp head or lamp holder structure, or an electric conductive interface structure configured by an electric conductive terminal structure, provided as a connection interface for the electric luminous body and an axial external electric power, and connected to the electric luminous body with an electric conductive member for transmitting electric power.

Figure 11:
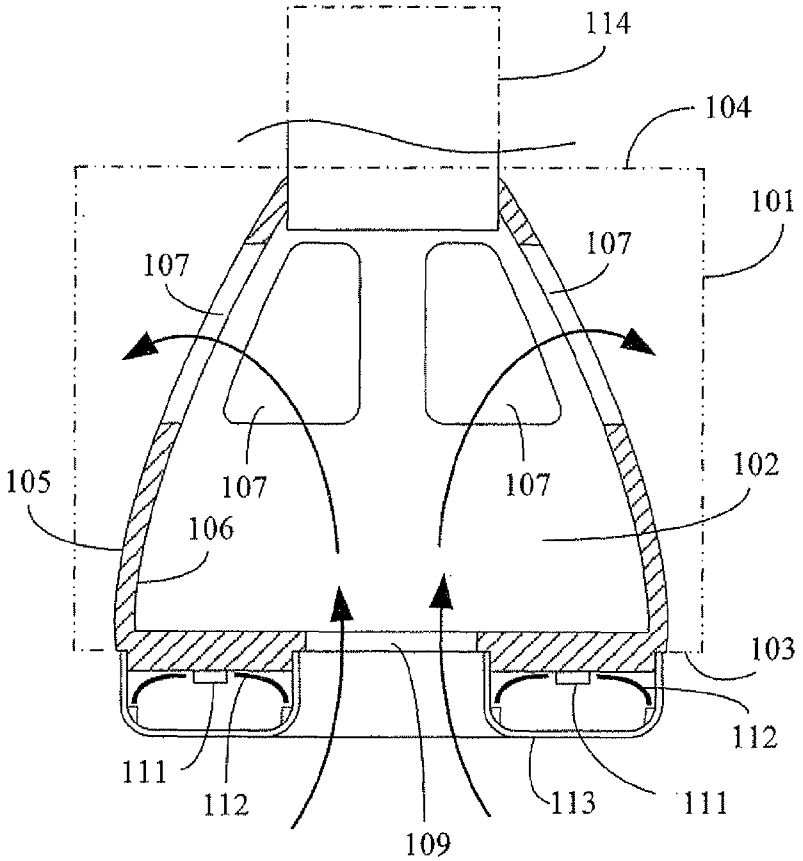
FIG. 11 is a schematic structural view illustrating the electric luminous body downwardly projecting light and being annularly installed at the light projection side of the heat dissipater (101) with axial and radial air apertures, and being formed with a central axial air inlet port (109), according to one embodiment of the present invention.
Figure 12:
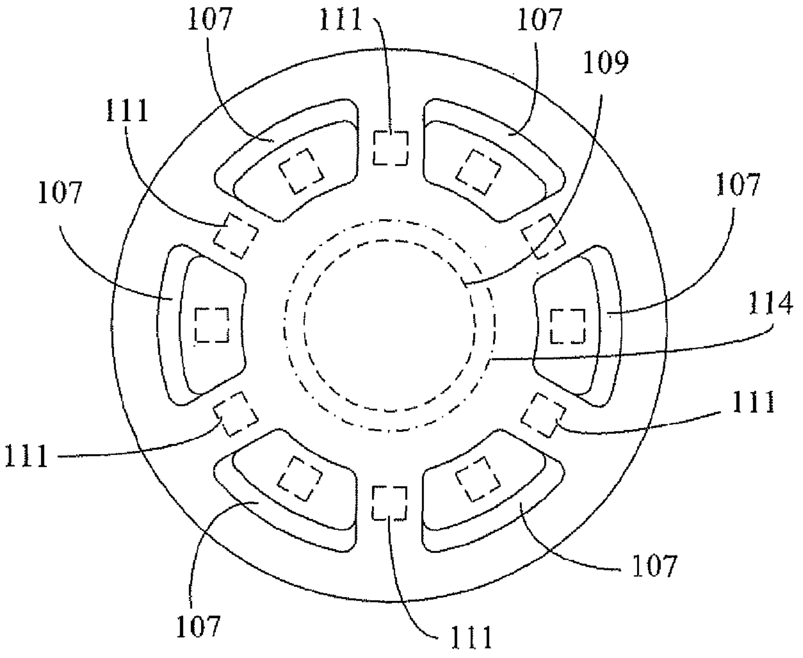
FIG. 12 is a top view of FIG. 11.

FIG. 11 is a schematic structural view illustrating the electric luminous body downwardly projecting light and being annularly installed at the light projection side of the heat dissipater (101) with axial and radial air apertures, and being formed with a central axial air inlet port (109), according to one embodiment of the present invention;

FIG. 12 is a top view of FIG. 11;

As shown in FIG. 11 and FIG. 12, it mainly consists of:

heat dissipater (101) with axial and radial air apertures: made of a material having good heat conductivity and formed as an integral or assembled hollow member, the outer radial surface is formed as a smooth surface, rib surface, grid surface, porous, net-shaped or fin-shaped structure, thereby forming an external heat dissipation surface (105); the radial interior is formed as a smooth surface, rib surface, grid surface, porous, net-shaped or fin-shaped structure, thereby forming an internal heat dissipation surface (106); the center is provided with an axial tubular flowpath (102) to constitute an axial hole allowing airflow to pass, and one axial side of the heat dissipater (101) with axial and radial air apertures is defined as a light projection side (103) allowing an electric luminous body to be installed thereon, and the other axial side is formed in a sealed or semi-sealed or opened structure for serving as a connection side (104) to be served as the external connecting structure;

one end of the heat dissipater (101) with axial and radial air aperture near the connection side (104) is installed with one or more than one radial air outlet holes (107), and said radial air outlet hole (107) includes grid holes configured by a hole-shaped or net-shaped structure;

central axial air inlet port (109): constituted by a central axial air inlet port structure installed on the axial end surface of the light projection side (103) of the heat dissipater (101) with axial and radial air aperture for communicating to the axial tubular flowpath (102), and said central axial air inlet port (109) includes grid holes configured by a hole-shaped or net-shaped structure;

With the mentioned structure when generating heat loss during the electric luminous body being electrically conducted for emitting light, the air flowing formed through the hot airflow in the heat dissipater (101) with axial and radial air aperture generating a hot ascent/cold descent effect for introducing airflow from the central axial air inlet port (109) of the light projection side (103) to pass the axial hole configured by the axial tubular flowpath (102) then be discharged from the radial air outlet hole (107) formed near the connection side (104) of the heat dissipater (101) with axial and radial air aperture, thereby discharging thermal energy in the axial tubular flowpath (102) to the exterior;

electric luminous body: constituted by one or more than one devices capable of being inputted with electric power for generating optical power, e.g. a LED (111) or LED module, installed at the inner periphery of the light projection side (103) of the heat dissipater (101) with axial and radial air apertures, downwardly disposed and projecting light to the exterior according to a set direction.

secondary optical device (112): optionally installed, provided with functions of condensing, diffusing, refracting or reflecting the optical energy of the LED (111) for projecting light to the exterior;

light-pervious lampshade (113): made of a light-pervious material, covering the LED (111) for the purpose of protecting the LED (111), and allowing the optical energy of LED (111) passing through for projecting to the exterior;

axially-fixed and electric-conductive interface (114): one end thereof is connected to the connection side (104) of the heat dissipater (101) with axial and radial air aperture, the other end is a screw-in type, insertion type or lock-on type lamp head or lamp holder structure, or an electric conductive interface structure configured by an electric conductive terminal structure, provided as a connection interface for the electric luminous body and an axial external electric power, and connected to the electric luminous body with an electric conductive member for transmitting electric power.

Figure 13:
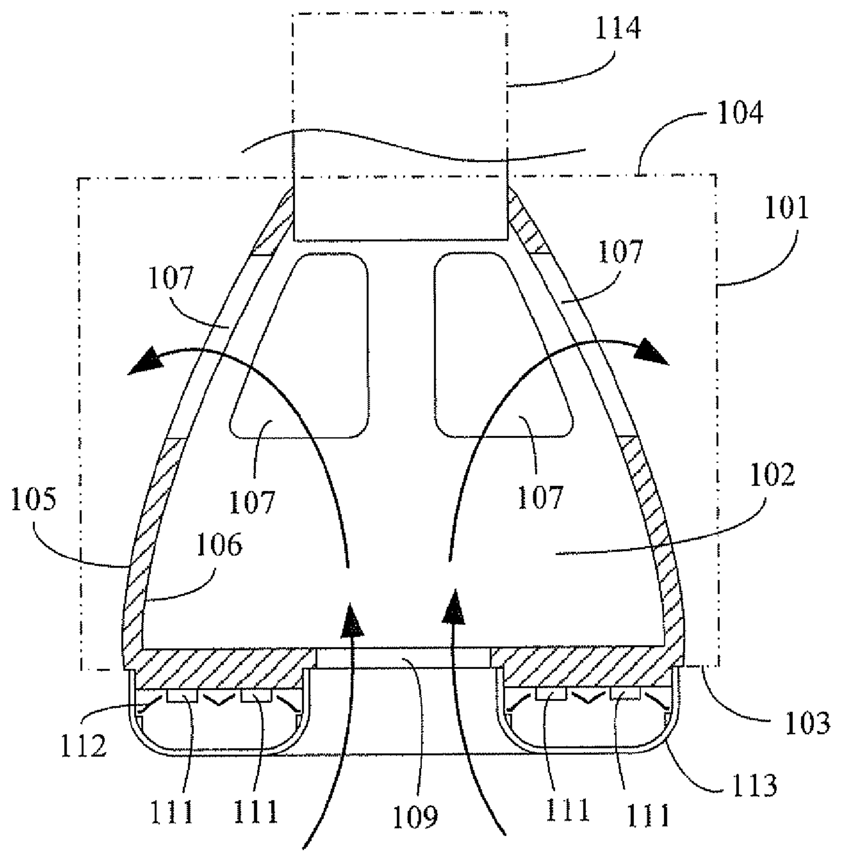
FIG. 13 is a schematic structural view illustrating the electric luminous body downwardly projecting light in a multiple circular manner and being annularly installed at the light projection side of the heat dissipater (101) with axial and radial air apertures, and being formed with a central axial air inlet port (109), according to one embodiment of the present invention.
Figure 14:
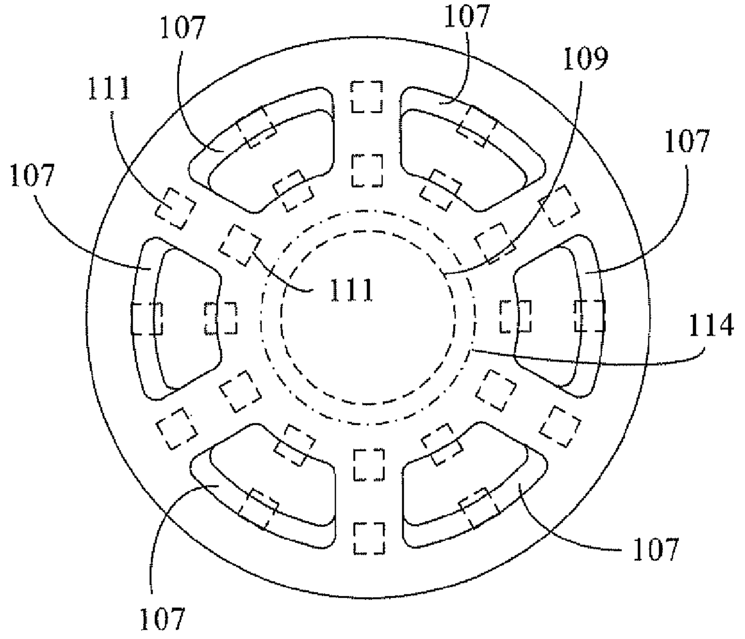
FIG. 14 is a top view of FIG. 13.

FIG. 13 is a schematic structural view illustrating the electric luminous body downwardly projecting light in a multiple circular manner and being annularly installed at the light projection side of the heat dissipater (101) with axial and radial air apertures, and being formed with a central axial air inlet port (109), according to one embodiment of the present invention;

FIG. 14 is a top view of FIG. 13;

As shown in FIG. 13 and FIG. 14, it mainly consists of:

heat dissipater (101) with axial and radial air apertures: made of a material having good heat conductivity and formed as an integral or assembled hollow member, the outer radial surface is formed as a smooth surface, rib surface, grid surface, porous, net-shaped or fin-shaped structure, thereby forming an external heat dissipation surface (105); the radial interior is formed as a smooth surface, rib surface, grid surface, porous, net-shaped or fin-shaped structure, thereby forming an internal heat dissipation surface (106); the center is provided with an axial tubular flowpath (102) to constitute an axial hole allowing airflow to pass, and one axial side of the heat dissipater (101) with axial and radial air apertures is defined as a light projection side (103) allowing an electric luminous body to be installed thereon, and the other axial side is formed in a sealed or semi-sealed or opened structure for serving as a connection side (104) to be served as the external connecting structure;

one end of the heat dissipater (101) with axial and radial air aperture near the connection side (104) is installed with one or more than one radial air outlet holes (107), and said radial air outlet hole (107) includes grid holes configured by a hole-shaped or net-shaped structure;

central axial air inlet port (109): constituted by a central axial air inlet port structure installed on the axial end surface of the light projection side (103) of the heat dissipater (101) with axial and radial air aperture for communicating to the axial tubular flowpath (102), and said central axial air inlet port (109) includes grid holes configured by a hole-shaped or net-shaped structure;

With the mentioned structure when generating heat loss during the electric luminous body being electrically conducted for emitting light, the air flowing formed through the hot airflow in the heat dissipater (101) with axial and radial air aperture generating a hot ascent/cold descent effect for introducing airflow from the central axial air inlet port (109) of the light projection side (103) to pass the axial hole configured by the axial tubular flowpath (102) then be discharged from the radial air outlet hole (107) formed near the connection side (104) of the heat dissipater (101) with axial and radial air aperture, thereby discharging thermal energy in the axial tubular flowpath (102) to the exterior;

electric luminous body: constituted by a plurality of devices capable of being inputted with electric power for generating optical power, e.g. a LED (111) or LED module, installed at the inner periphery of the light projection side (103) of the heat dissipater (101) with axial and radial air apertures, downwardly disposed in a multiple circular manner, and projecting light to the exterior according to a set direction;

secondary optical device (112): optionally installed, provided with functions of condensing, diffusing, refracting or reflecting the optical energy of the LED (111) for projecting light to the exterior;

light-pervious lampshade (113): made of a light-pervious material, covering the LED (111) for the purpose of protecting the LED (111), and allowing the optical energy of LED (111) passing through for projecting to the exterior;

axially-fixed and electric-conductive interface (114): one end thereof is connected to the connection side (104) of the heat dissipater (101) with axial and radial air aperture, the other end is a screw-in type, insertion type or lock-on type lamp head or lamp holder structure, or an electric conductive interface structure configured by an electric conductive terminal structure, provided as a connection interface for the electric luminous body and an axial external electric power, and connected to the electric luminous body with an electric conductive member for transmitting electric power.

Figure 15:
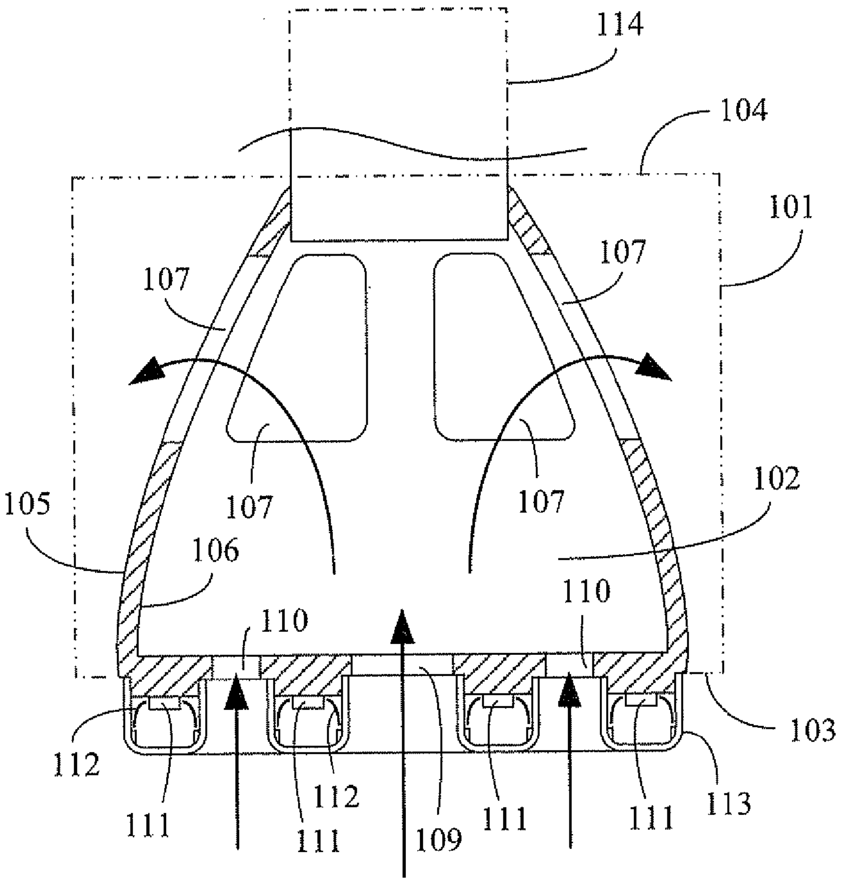
FIG. 15 is a schematic structural view illustrating the electric luminous body downwardly projecting light in a multiple circular manner and being annularly installed at the light projection side of the heat dissipater (101) with axial and radial air apertures, and being formed with an air inlet port (110) annularly arranged near the periphery of axial end surface and formed with a central axial air inlet port (109) at the periphery of the light projection side or between the electric luminous body downwardly projecting light in a multiple circular manner and annularly installed, according to one embodiment of the present invention.
Figure 16:
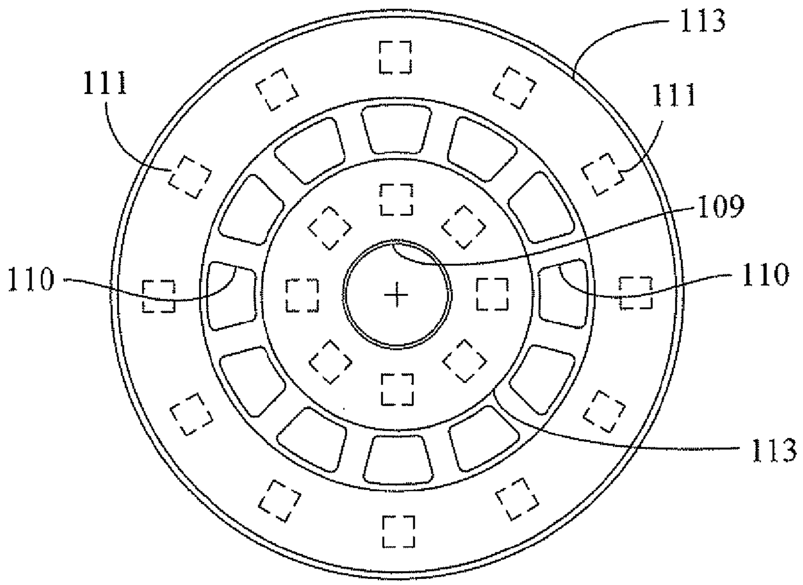
FIG. 16 is a bottom view of FIG. 15.

FIG. 15 is a schematic structural view illustrating the electric luminous body downwardly projecting light in a multiple circular manner and being annularly installed at the light projection side of the heat dissipater (101) with axial and radial air apertures, and being formed with an air inlet port (110) annularly arranged near the periphery of axial end surface and formed with a central axial air inlet port (109) at the periphery of the light projection side or between the electric luminous body downwardly projecting light in a multiple circular manner and annularly installed, according to one embodiment of the present invention;

FIG. 16 is a bottom view of FIG. 15;

As shown in FIG. 15 and FIG. 16, it mainly consists of:

heat dissipater (101) with axial and radial air apertures: made of a material having good heat conductivity and formed as an integral or assembled hollow member, the outer radial surface is formed as a smooth surface, rib surface, grid surface, porous, net-shaped or fin-shaped structure, thereby forming an external heat dissipation surface (105); the radial interior is formed as a smooth surface, rib surface, grid surface, porous, net-shaped or fin-shaped structure, thereby forming an internal heat dissipation surface (106); the center is provided with an axial tubular flowpath (102) to constitute an axial hole allowing airflow to pass, and one axial side of the heat dissipater (101) with axial and radial air apertures is defined as a light projection side (103) allowing an electric luminous body to be installed thereon, and the other axial side is formed in a sealed or semi-sealed or opened structure for serving as a connection side (104) to be served as the external connecting structure;

one end of the heat dissipater (101) with axial and radial air aperture near the connection side (104) is installed with one or more than one radial air outlet holes (107), and said radial air outlet hole (107) includes grid holes configured by a hole-shaped or net-shaped structure;

central axial air inlet port (109): constituted by a central axial air inlet port structure installed on the axial end surface of the light projection side (103) of the heat dissipater (101) with axial and radial air aperture for communicating to the axial tubular flowpath (102), and said central axial air inlet port (109) includes grid holes configured by a hole-shaped or net-shaped structure;

air inlet port (110) annularly arranged near the periphery of axial end surface: constituted by one or more than one air inlet port structures annularly installed near the periphery of axial end surface of the light projection side (103) of the heat dissipater (101) with axial and radial air apertures or between the LED (111) downwardly projecting light in a multiple circular manner and annularly installed for communicating to the axial tubular flowpath (102), and said air inlet port (110) annularly arranged near the periphery of axial end surface includes grid holes configured by a hole-shaped or net-shaped structure;

With the mentioned structure when generating heat loss during the electric luminous body being electrically conducted for emitting light, the air flowing formed through the hot airflow in the heat dissipater (101) with axial and radial air aperture generating a hot ascent/cold descent effect for introducing airflow from the central axial air inlet port (109) and the air inlet port (110) annularly arranged near the periphery of axial end surface of the light projection side (103) to pass the axial hole structured by the axial tubular flowpath (102) then be discharged from the radial air outlet hole (107) formed near the connection side (104) of the heat dissipater (101) with axial and radial air aperture, thereby discharging thermal energy in the axial tubular flowpath (102) to the exterior;

electric luminous body: constituted by a plurality of devices capable of being inputted with electric power for generating optical power, e.g. a LED (111) or LED module, installed at the inner periphery of the light projection side (103) of the heat dissipater (101) with axial and radial air apertures, downwardly disposed in a multiple circular manner, and projecting light to the exterior according to a set direction;

secondary optical device (112): optionally installed, provided with functions of condensing, diffusing, refracting or reflecting the optical energy of the LED (111) for projecting light to the exterior;

light-pervious lampshade (113): made of a light-pervious material, covering the LED (111) for the purpose of protecting the LED (111), and allowing the optical energy of LED (111) passing through for projecting to the exterior;

axially-fixed and electric-conductive interface (114): one end thereof is connected to the connection side (104) of the heat dissipater (101) with axial and radial air aperture, the other end is a screw-in type, insertion type or lock-on type lamp head or lamp holder structure, or an electric conductive interface structure configured by an electric conductive terminal structure, provided as a connection interface for the electric luminous body and an axial external electric power, and connected to the electric luminous body with an electric conductive member for transmitting electric power.

Figure 17:
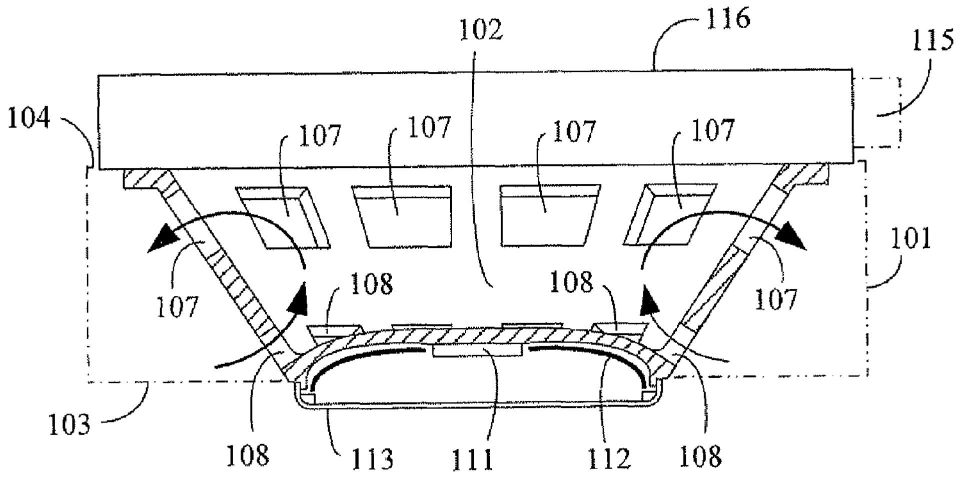
FIG. 17 is a schematic structural view illustrating the embodiment disclosed in FIG. 3 being applied in a heat dissipater (101) with axial and radial air aperture having the top being installed with a radially-fixed and electric conductive interface (115) and installed with a top cover member (116), according to one embodiment of the present invention.
Figure 18:
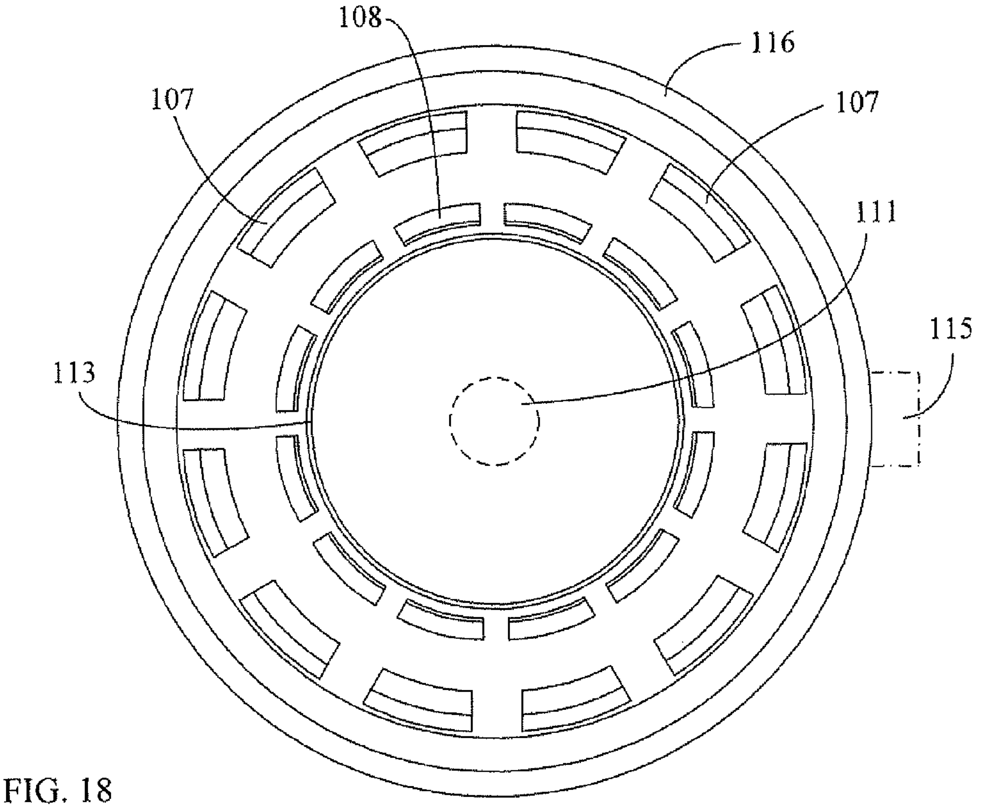
FIG. 18 is a bottom view of FIG. 17.

FIG. 17 is a schematic structural view illustrating the embodiment disclosed in FIG. 3 being applied in a heat dissipater (101) with axial and radial air aperture having the top being installed with a radially-fixed and electric conductive interface (115) and installed with a top cover member (116), according to one embodiment of the present invention;

FIG. 18 is a bottom view of FIG. 17;

As shown in FIG. 17 and FIG. 18, the radially-fixed and electric-conductive interface (115) is used for replacing the axially-fixed and electric-conductive interface (114), and a top cover member (116) is further installed, all the other components are the same as what is shown in FIG. 3;

Wherein:

radially-fixed and electric-conductive interface (115): one end thereof is connected to the connection side (104) of the heat dissipater (101) with axial and radial air aperture, the other end is a screw-in type, insertion type or lock-on type lamp head or lamp holder structure, or an electric conductive interface structure configured by an electric conductive terminal structure, provided as a connection interface for the electric luminous body and a radial external electric power, and connected to the electric luminous body with an electric conductive member for transmitting electric power;

top cover member (116): made of a thermal conductive or non thermal conductive material, connected at the connection side (104) of the heat dissipater (101) with axial and radial air apertures for guiding the shape of the airflow at the inner top space of the heat dissipater (101) with axial and radial air apertures to be radially diffused, or providing functions of optical reflecting or refracting or condensing or diffusing; when being made of a non thermal conductive material, the top cover member (116) further provides with a function of insulating or reducing the heat transmission between the inner top space of the heat dissipater (101) with axial and radial air apertures and the exterior; when being made of a thermal conductive material, the top cover member (116) further provides a function of assisting the airflow having relatively higher temperature inside the heat dissipater (101) with axial and radial air apertures to be dissipated to the exterior.

Figure 19:
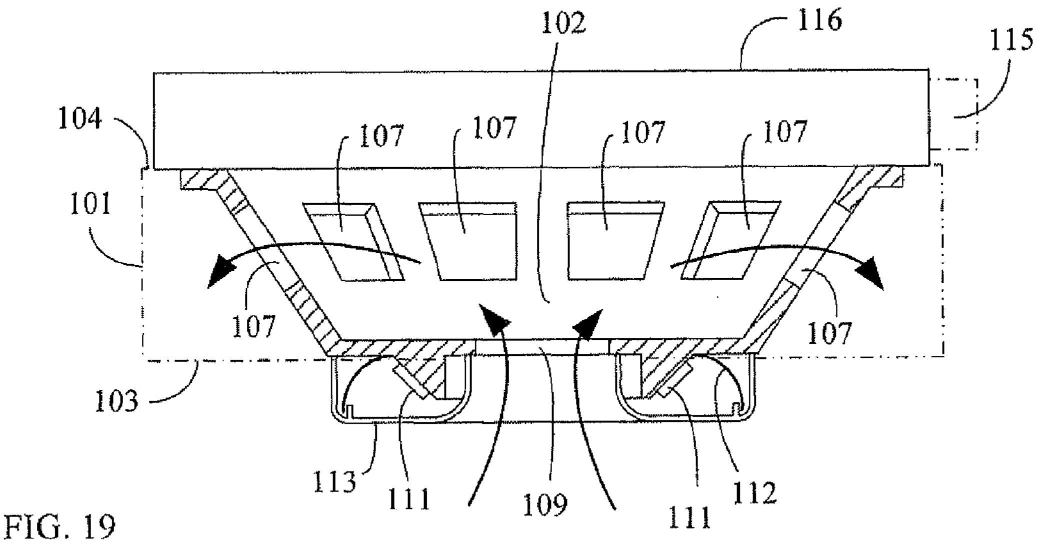
FIG. 19 is a schematic structural view illustrating the embodiment disclosed in FIG. 5 being applied in the heat dissipater (101) with axial and radial air aperture having the top being installed with a radially-fixed and electric conductive interface (115) and installed with a top cover member (116), according to one embodiment of the present invention.
Figure 20:
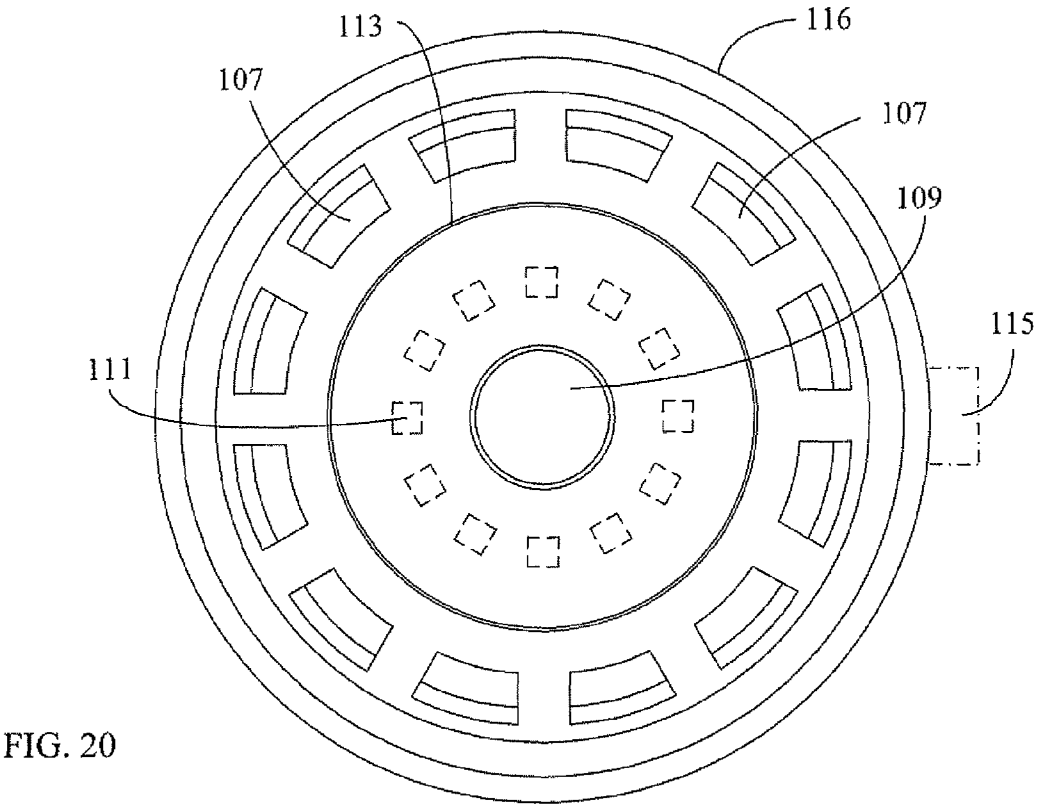
FIG. 20 is a bottom view of FIG. 19.

FIG. 19 is a schematic structural view illustrating the embodiment disclosed in FIG. 5 being applied in a heat dissipater (101) with axial and radial air aperture having the top being installed with a radially-fixed and electric conductive interface (115) and installed with a top cover member (116), according to one embodiment of the present invention;

FIG. 20 is a bottom view of FIG. 19;

As shown in FIG. 19 and FIG. 20, the radially-fixed and electric-conductive interface (115) is used for replacing the axially-fixed and electric-conductive interface (114), and a top cover member (116) is further installed, all the other components are the same as what is shown in FIG. 5;

Wherein:

radially-fixed and electric-conductive interface (115): one end thereof is connected to the connection side (104) of the heat dissipater (101) with axial and radial air aperture, the other end is a screw-in type, insertion type or lock-on type lamp head or lamp holder structure, or an electric conductive interface structure configured by an electric conductive terminal structure, provided as a connection interface for the electric luminous body and a radial external electric power, and connected to the electric luminous body with an electric conductive member for transmitting electric power;

top cover member (116): made of a thermal conductive or non thermal conductive material, connected at the connection side (104) of the heat dissipater (101) with axial and radial air aperture for guiding the shape of the airflow at the inner top space of the heat dissipater (101) with axial and radial air aperture to be radially diffused, or providing functions of optical reflecting or refracting or condensing or diffusing; when being made of a non thermal conductive material, the top cover member (116) further provides with a function of insulating or reducing the heat transmission between the inner top space of the heat dissipater (101) with axial and radial air aperture and the exterior; when being made of a thermal conductive material, the top cover member (116) further provides a function of assisting the airflow having relatively higher temperature inside the heat dissipater (101) with axial and radial air aperture to be dissipated to the exterior.

Figure 21:
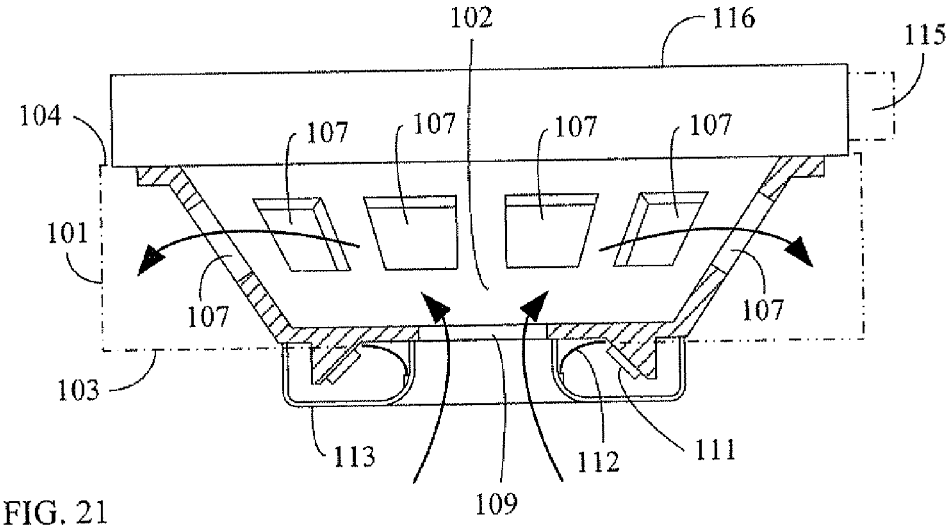
FIG. 21 is a schematic structural view illustrating the embodiment disclosed in FIG. 7 being applied in the heat dissipater (101) with axial and radial air aperture having the top being installed with a radially-fixed and electric conductive interface (115) and installed with a top cover member (116), according to one embodiment of the present invention.
Figure 22:
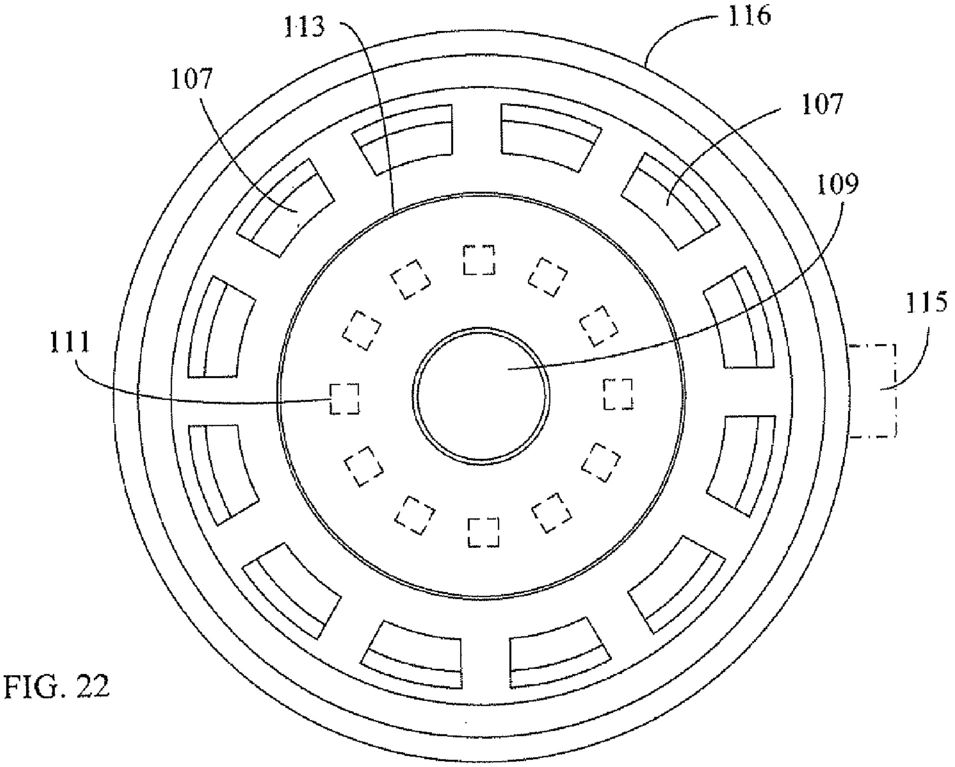
FIG. 22 is a bottom view of FIG. 21.

FIG. 21 is a schematic structural view illustrating the embodiment disclosed in FIG. 7 being applied in a heat dissipater (101) with axial and radial air aperture having the top being installed with a radially-fixed and electric conductive interface (115) and installed with a top cover member (116), according to one embodiment of the present invention;

FIG. 22 is a bottom view of FIG. 21;

As shown in FIG. 21 and FIG. 22, the radially-fixed and electric-conductive interface (115) is used for replacing the axially-fixed and electric-conductive interface (114), and a top cover member (116) is further installed, all the other components are the same as what is shown in FIG. 7;

Wherein:

radially-fixed and electric-conductive interface (115): one end thereof is connected to the connection side (104) of the heat dissipater (101) with axial and radial air aperture, the other end is a screw-in type, insertion type or lock-on type lamp head or lamp holder structure, or an electric conductive interface structure configured by an electric conductive terminal structure, provided as a connection interface for the electric luminous body and a radial external electric power, and connected to the electric luminous body with an electric conductive member for transmitting electric power;

top cover member (116): made of a thermal conductive or non thermal conductive material, connected at the connection side (104) of the heat dissipater (101) with axial and radial air aperture for guiding the shape of the airflow at the inner top space of the heat dissipater (101) with axial and radial air aperture to be radially diffused, or providing functions of optical reflecting or refracting or condensing or diffusing; when being made of a non thermal conductive material, the top cover member (116) further provides with a function of insulating or reducing the heat transmission between the inner top space of the heat dissipater (101) with axial and radial air aperture and the exterior; when being made of a thermal conductive material, the top cover member (116) further provides a function of assisting the airflow having relatively higher temperature inside the heat dissipater (101) with axial and radial air aperture to be dissipated to the exterior.

Figure 23:
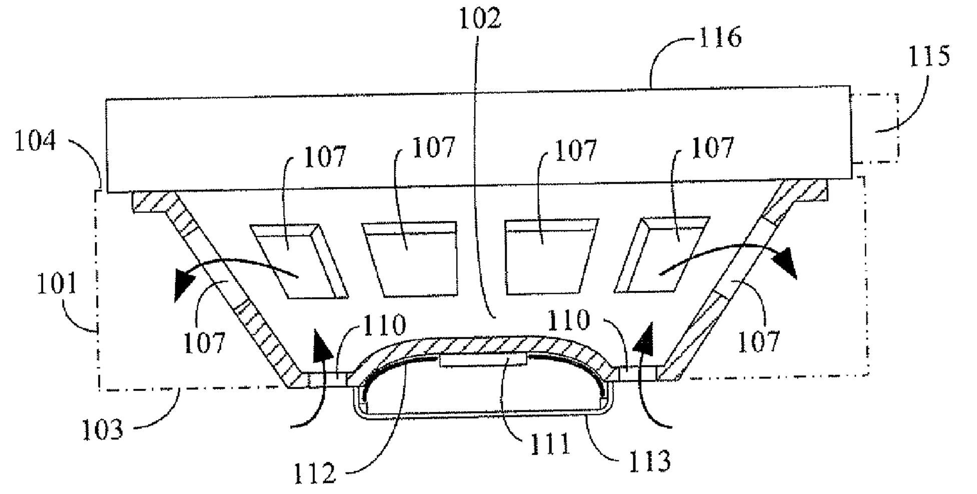
FIG. 23 is a schematic structural view illustrating the embodiment disclosed in FIG. 9 being applied in the heat dissipater (101) with axial and radial air aperture having the top being installed with a radially-fixed and electric conductive interface (115) and installed with a top cover member (116), according to one embodiment of the present invention.
Figure 24:
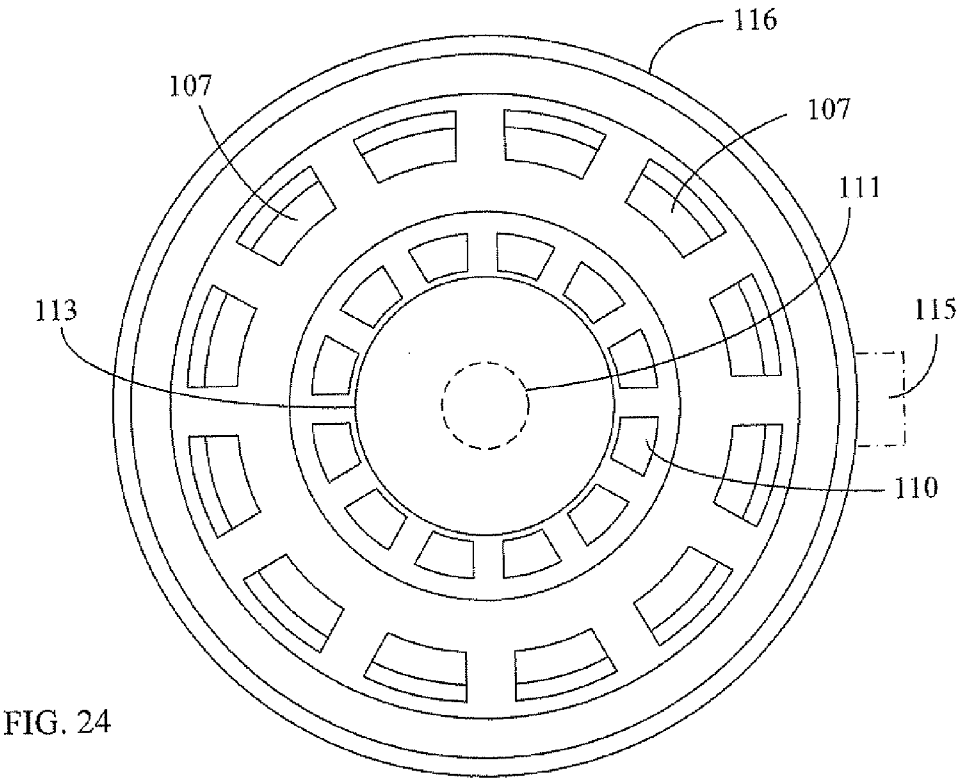
FIG. 24 is a bottom view of FIG. 23.

FIG. 23 is a schematic structural view illustrating the embodiment disclosed in FIG. 9 being applied in a heat dissipater (101) with axial and radial air aperture having the top being installed with a radially-fixed and electric conductive interface (115) and installed with a top cover member (116), according to one embodiment of the present invention;

FIG. 24 is a bottom view of FIG. 23;

As shown in FIG. 23 and FIG. 24, the radially-fixed and electric-conductive interface (115) is used for replacing the axially-fixed and electric-conductive interface (114), and a top cover member (116) is further installed, all the other components are the same as what is shown in FIG. 9;

Wherein:

radially-fixed and electric-conductive interface (115): one end thereof is connected to the connection side (104) of the heat dissipater (101) with axial and radial air aperture, the other end is a screw-in type, insertion type or lock-on type lamp head or lamp holder structure, or an electric conductive interface structure configured by an electric conductive terminal structure, provided as a connection interface for the electric luminous body and a radial external electric power, and connected to the electric luminous body with an electric conductive member for transmitting electric power;

top cover member (116): made of a thermal conductive or non thermal conductive material, connected at the connection side (104) of the heat dissipater (101) with axial and radial air aperture for guiding the shape of the airflow at the inner top space of the heat dissipater (101) with axial and radial air aperture to be radially diffused, or providing functions of optical reflecting or refracting or condensing or diffusing; when being made of a non thermal conductive material, the top cover member (116) further provides with a function of insulating or reducing the heat transmission between the inner top space of the heat dissipater (101) with axial and radial air aperture and the exterior; when being made of a thermal conductive material, the top cover member (116) further provides a function of assisting the airflow having relatively higher temperature inside the heat dissipater (101) with axial and radial air aperture to be dissipated to the exterior.

Figure 25:
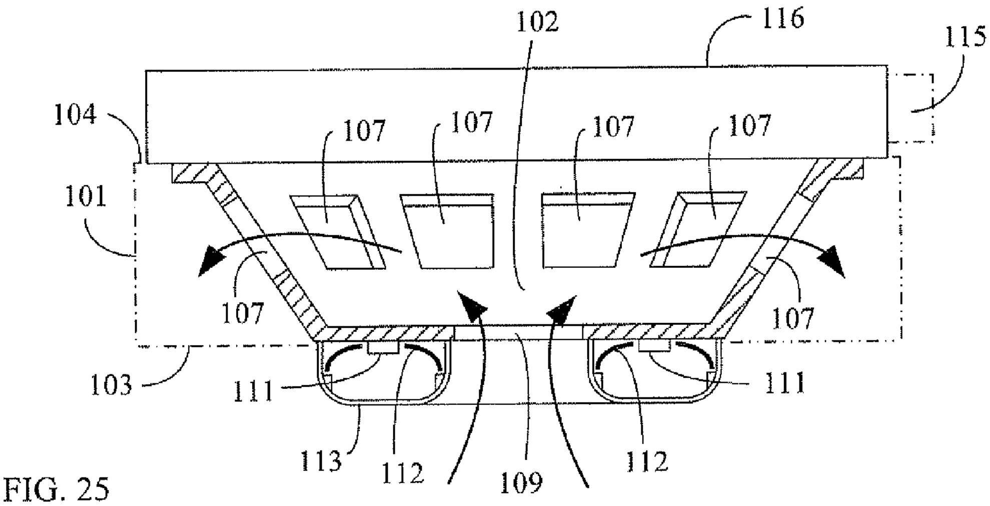
FIG. 25 is a schematic structural view illustrating the embodiment disclosed in FIG. 11 being applied in the heat dissipater (101) with axial and radial air aperture having the top being installed with a radially-fixed and electric conductive interface (115) and installed with a top cover member (116), according to one embodiment of the present invention.
Figure 26:
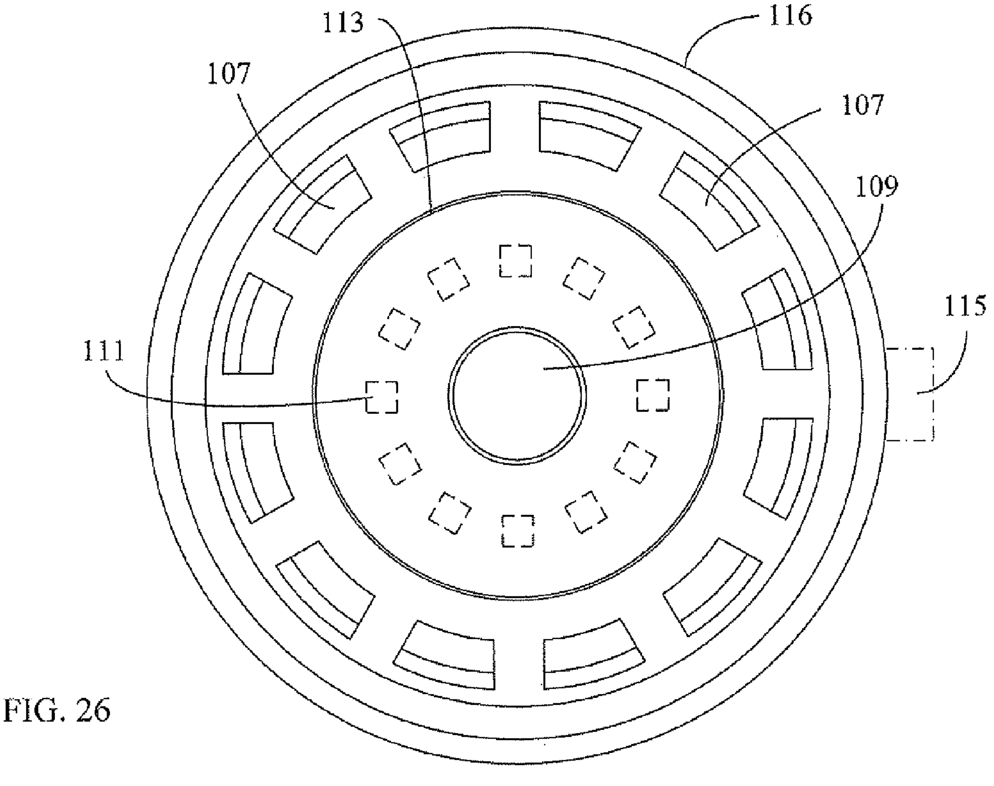
FIG. 26 is a bottom view of FIG. 25.

FIG. 25 is a schematic structural view illustrating the embodiment disclosed in FIG. 11 being applied in a heat dissipater (101) with axial and radial air aperture having the top being installed with a radially-fixed and electric conductive interface (115) and installed with a top cover member (116), according to one embodiment of the present invention;

FIG. 26 is a bottom view of FIG. 25;

As shown in FIG. 25 and FIG. 26, the radially-fixed and electric-conductive interface (115) is used for replacing the axially-fixed and electric-conductive interface (114), and a top cover member (116) is further installed, all the other components are the same as what is shown in FIG. 11;

Wherein:

radially-fixed and electric-conductive interface (115): one end thereof is connected to the connection side (104) of the heat dissipater (101) with axial and radial air aperture, the other end is a screw-in type, insertion type or lock-on type lamp head or lamp holder structure, or an electric conductive interface structure configured by an electric conductive terminal structure, provided as a connection interface for the electric luminous body and a radial external electric power, and connected to the electric luminous body with an electric conductive member for transmitting electric power;

top cover member (116): made of a thermal conductive or non thermal conductive material, connected at the connection side (104) of the heat dissipater (101) with axial and radial air aperture for guiding the shape of the airflow at the inner top space of the heat dissipater (101) with axial and radial air aperture to be radially diffused, or providing functions of optical reflecting or refracting or condensing or diffusing; when being made of a non thermal conductive material, the top cover member (116) further provides with a function of insulating or reducing the heat transmission between the inner top space of the heat dissipater (101) with axial and radial air aperture and the exterior; when being made of a thermal conductive material, the top cover member (116) further provides a function of assisting the airflow having relatively higher temperature inside the heat dissipater (101) with axial and radial air aperture to be dissipated to the exterior.

Figure 27:
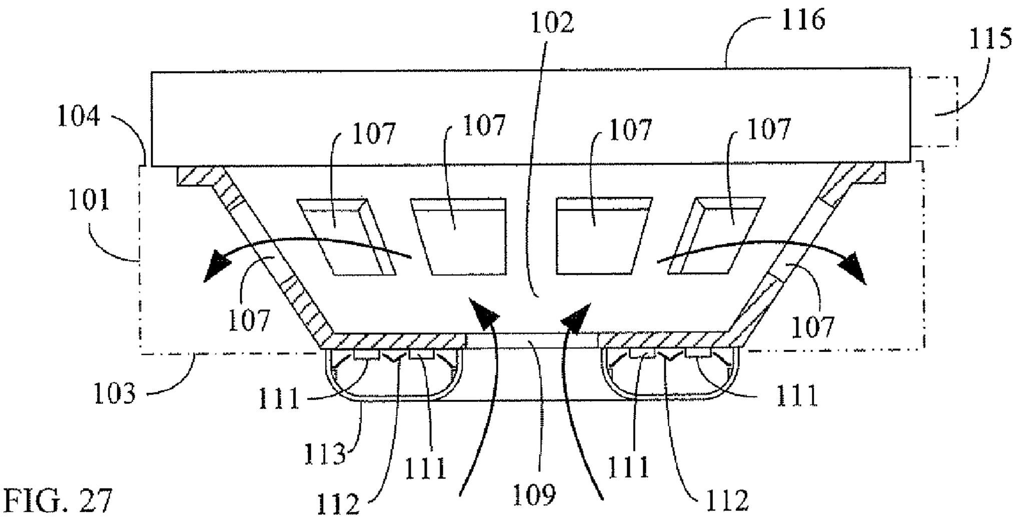
FIG. 27 is a schematic structural view illustrating the embodiment disclosed in FIG. 13 being applied in the heat dissipater (101) with axial and radial air aperture having the top being installed with a radially-fixed and electric conductive interface (115) and installed with a top cover member (116), according to one embodiment of the present invention.
Figure 28:
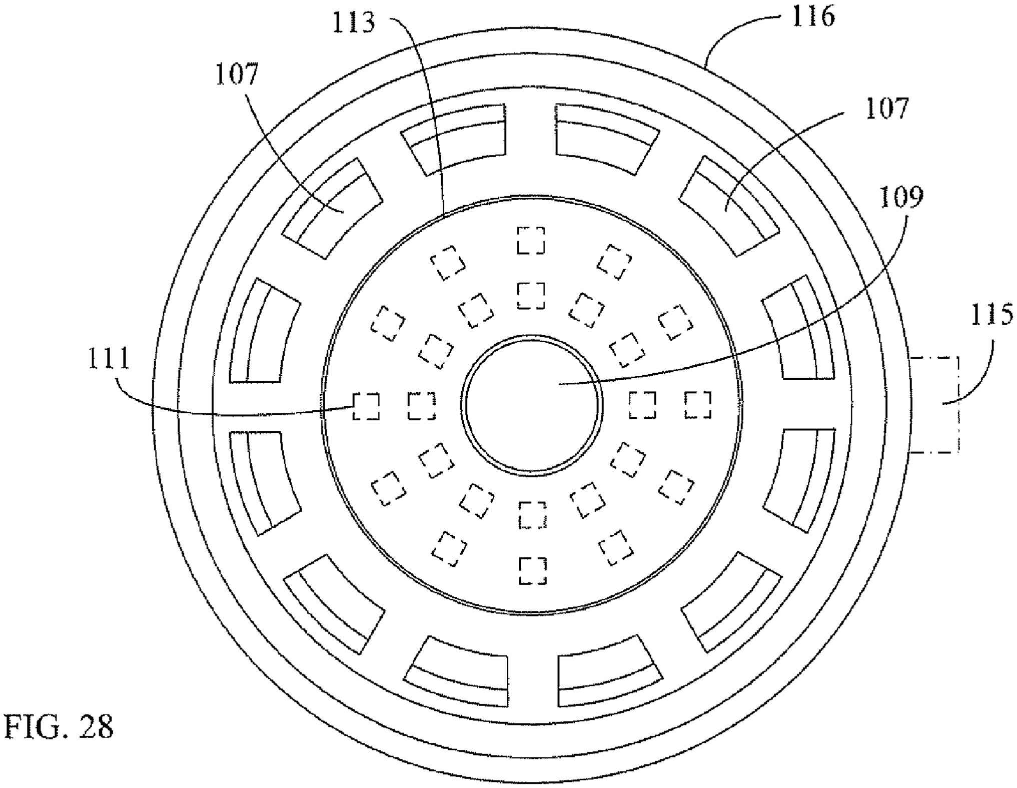
FIG. 28 is a bottom view of FIG. 27.

FIG. 27 is a schematic structural view illustrating the embodiment disclosed in FIG. 13 being applied in a heat dissipater (101) with axial and radial air aperture having the top being installed with a radially-fixed and electric conductive interface (115) and installed with a top cover member (116), according to one embodiment of the present invention;

FIG. 28 is a bottom view of FIG. 27;

As shown in FIG. 27 and FIG. 28, the radially-fixed and electric-conductive interface (115) is used for replacing the axially-fixed and electric-conductive interface (114), and a top cover member (116) is further installed, all the other components are the same as what is shown in FIG. 13;

Wherein:

radially-fixed and electric-conductive interface (115): one end thereof is connected to the connection side (104) of the heat dissipater (101) with axial and radial air aperture, the other end is a screw-in type, insertion type or lock-on type lamp head or lamp holder structure, or an electric conductive interface structure configured by an electric conductive terminal structure, provided as a connection interface for the electric luminous body and a radial external electric power, and connected to the electric luminous body with an electric conductive member for transmitting electric power;

top cover member (116): made of a thermal conductive or non thermal conductive material, connected at the connection side (104) of the heat dissipater (101) with axial and radial air aperture for guiding the shape of the airflow at the inner top space of the heat dissipater (101) with axial and radial air aperture to be radially diffused, or providing functions of optical reflecting or refracting or condensing or diffusing; when being made of a non thermal conductive material, the top cover member (116) further provides with a function of insulating or reducing the heat transmission between the inner top space of the heat dissipater (101) with axial and radial air aperture and the exterior; when being made of a thermal conductive material, the top cover member (116) further provides a function of assisting the airflow having relatively higher temperature inside the heat dissipater (101) with axial and radial air aperture to be dissipated to the exterior.

Figure 29:
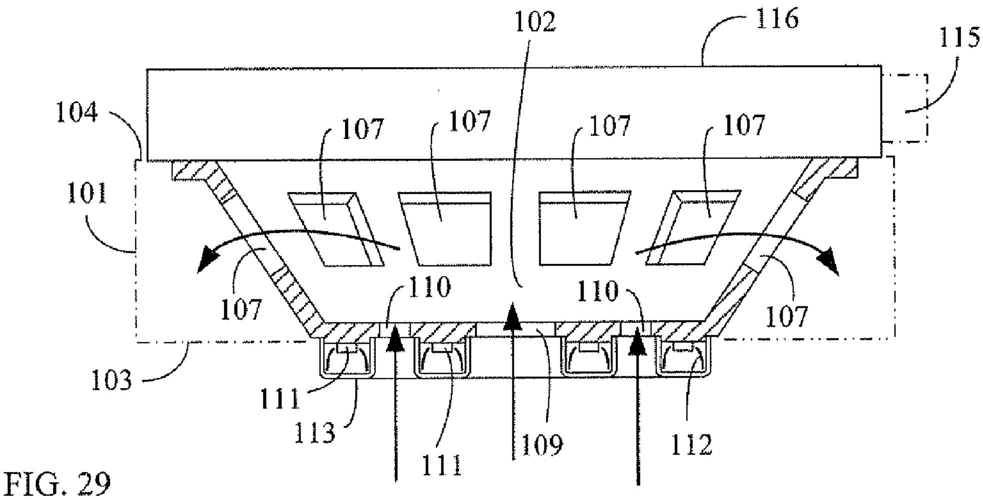
FIG. 29 is a schematic structural view illustrating the embodiment disclosed in FIG. 15 being applied in the heat dissipater (101) with axial and radial air aperture having the top being installed with a radially-fixed and electric conductive interface (115) and installed with a top cover member (116), according to one embodiment of the present invention.
Figure 30:
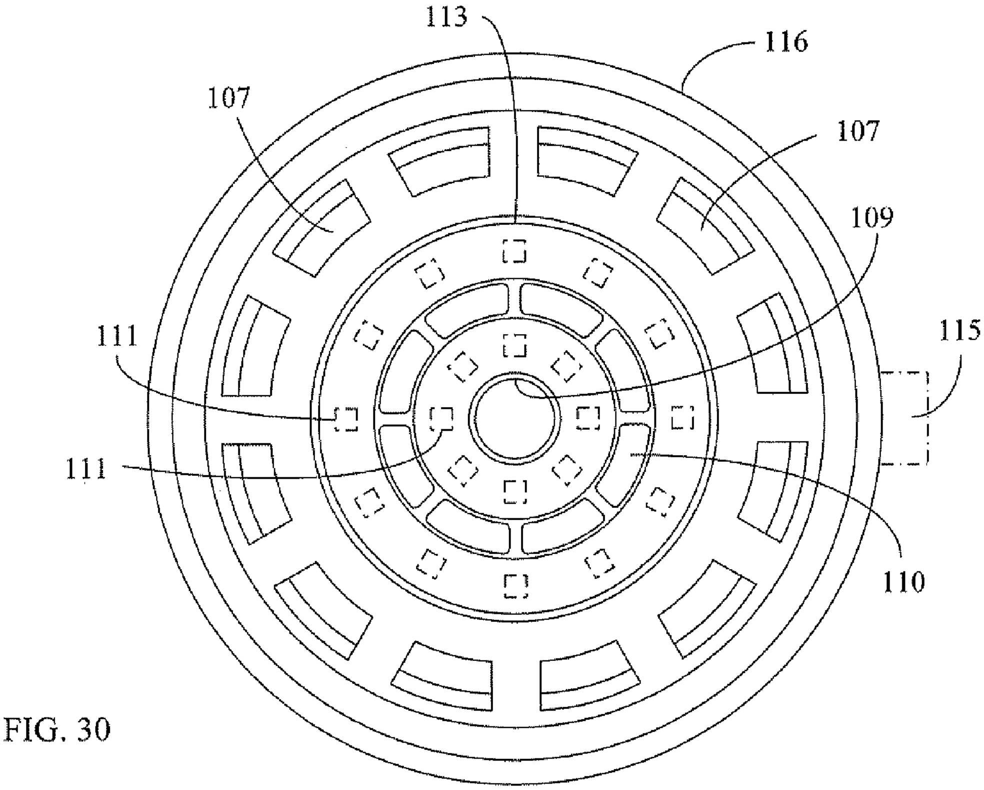
FIG. 30 is a bottom view of FIG. 29.

FIG. 29 is a schematic structural view illustrating the embodiment disclosed in FIG. 15 being applied in a heat dissipater (101) with axial and radial air aperture having the top being installed with a radially-fixed and electric conductive interface (115) and installed with a top cover member (116), according to one embodiment of the present invention;

FIG. 30 is a bottom view of FIG. 29;

As shown in FIG. 29 and FIG. 30, the radially-fixed and electric-conductive interface (115) is used for replacing the axially-fixed and electric-conductive interface (114), and a top cover member (116) is further installed, all the other components are the same as what is shown in FIG. 15;

Wherein:

radially-fixed and electric-conductive interface (115): one end thereof is connected to the connection side (104) of the heat dissipater (101) with axial and radial air aperture, the other end is a screw-in type, insertion type or lock-on type lamp head or lamp holder structure, or an electric conductive interface structure configured by an electric conductive terminal structure, provided as a connection interface for the electric luminous body and a radial external electric power, and connected to the electric luminous body with an electric conductive member for transmitting electric power;

top cover member (116): made of a thermal conductive or non thermal conductive material, connected at the connection side (104) of the heat dissipater (101) with axial and radial air aperture for guiding the shape of the airflow at the inner top space of the heat dissipater (101) with axial and radial air aperture to be radially diffused, or providing functions of optical reflecting or refracting or condensing or diffusing; when being made of a non thermal conductive material, the top cover member (116) further provides with a function of insulating or reducing the heat transmission between the inner top space of the heat dissipater (101) with axial and radial air aperture and the exterior; when being made of a thermal conductive material, the top cover member (116) further provides a function of assisting the airflow having relatively higher temperature inside the heat dissipater (101) with axial and radial air aperture to be dissipated to the exterior.

Figure 31:
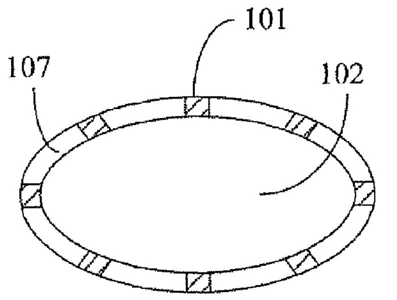
FIG. 31 is a schematic view illustrating the axial A-A cross section of the axial tubular flowpath (102) shown in FIG. 1 being formed as an oval hole, according to one embodiment of the present invention.

According to the present invention, when the electric luminous body having heat dissipater with axial and radial air aperture being further applied, air inlet ports can be installed at plural locations, wherein:

one end of the heat dissipater (101) with axial and radial air aperture near the connection side (104) is installed with one or more than one radial air outlet holes (107), and the light projection side (103) is installed with air inlet ports, said air inlet ports are installed to at least one or more than one of three locations which include the outer periphery being installed with a radial air inlet port (108) and/or the center of axial end surface of the light projection side (103) being installed with a central axial air inlet port (109) and/or the light projection side (103) being installed with an air inlet port (110) annularly arranged near the periphery of axial end surface;

According to the heat dissipater with axial and radial air aperture and application device thereof, the shape of the axial tubular flowpath (102) is not limited to be formed in the round shape, which can be further included with an oval tubular flowpath, triangle tubular flowpath, rectangular tubular flowpath, pentagonal tubular flowpath, hexangular tubular flowpath, polygonal tubular flowpath having more than six angles, U-shaped tubular flowpath, singular-slot hole tubular flowpath with dual open ends, or multiple-slot hole tubular flowpath with dual open ends; or can be shaped to a cross section having plural angles or geometric shapes, etc., illustrated with the following embodiment:

FIG. 31 is a schematic view illustrating the axial A-A cross section of the axial tubular flowpath (102) shown in FIG. 1 being formed as an oval hole, according to one embodiment of the present invention.

As shown in FIG. 31 the main configuration is that the heat dissipater (101) with axial and radial air aperture is made of a material having good thermal conductivity, and between the radial air outlet hole near the connection side (104) and the air inlet port near the light projection side (103), the axial tubular flowpath (102) is served as a communicated tubular flowpath, wherein the A-A cross section of the tubular flowpath is in an oval shape.

Figure 32:
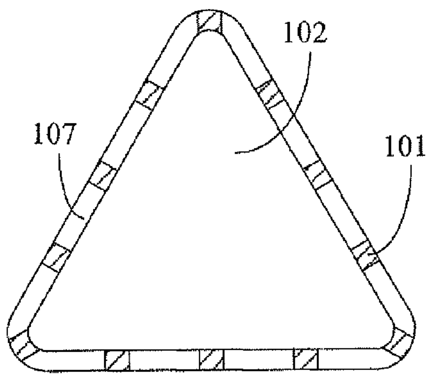
FIG. 32 is a schematic view illustrating the axial A-A cross section of the axial tubular flowpath (102) shown in FIG. 1 being formed as a triangular hole, according to one embodiment of the present invention.

FIG. 32 is a schematic view illustrating the axial A-A cross section of the axial tubular flowpath (102) shown in FIG. 1 being formed as a triangular hole, according to one embodiment of the present invention;

As shown in FIG. 32, the main configuration is that the heat dissipater (101) with axial and radial air aperture is made of a material having good thermal conductivity, and between the radial air outlet hole near the connection side (104) and the air inlet port near the light projection side (103), the axial tubular flowpath (102) is served as a communicated tubular flowpath, wherein the A-A cross section of the tubular flowpath is in a triangular or triangular-like shape.

Figure 33:
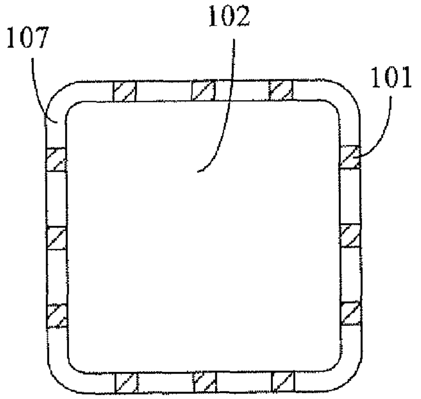
FIG. 33 is a schematic view illustrating the axial A-A cross section of the axial tubular flowpath (102) shown in FIG. 1 being formed as a rectangular hole, according to one embodiment of the present invention.

FIG. 33 is a schematic view illustrating the axial A-A cross section of the axial tubular flowpath (102) shown in FIG. 1 being formed as a rectangular hole, according to one embodiment of the present invention;

As shown in FIG. 33, the main configuration is that the heat dissipater (101) with axial and radial air aperture is made of a material having good thermal conductivity, and between the radial air outlet hole near the connection side (104) and the air inlet port near the light projection side (103), the axial tubular flowpath (102) is served as a communicated tubular flowpath, wherein the A-A cross section of the tubular flowpath is in a rectangular or rectangular-like shape.

Figure 34:
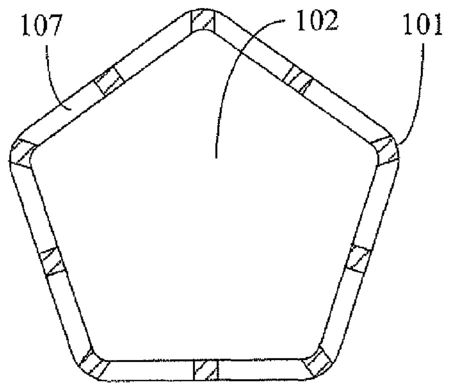
FIG. 34 is a schematic view illustrating the axial A-A cross section of the axial tubular flowpath (102) shown in FIG. 1 being formed as a pentagonal hole, according to one embodiment of the present invention.

FIG. 34 is a schematic view illustrating the axial A-A cross section of the axial tubular flowpath (102) shown in FIG. 1 being formed as a pentagonal hole, according to one embodiment of the present invention;

As shown in FIG. 34, the main configuration is that the heat dissipater (101) with axial and radial air aperture is made of a material having good thermal conductivity, and between the radial air outlet hole near the connection side (104) and the air inlet port near the light projection side (103), the axial tubular flowpath (102) is served as a communicated tubular flowpath, wherein the A-A cross section of the tubular flowpath is in a pentagonal or pentagonal-like shape.

Figure 35:
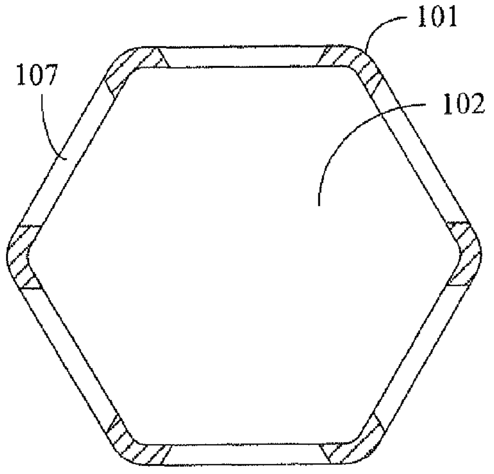
FIG. 35 is a schematic view illustrating the axial A-A cross section of the axial tubular flowpath (102) shown in FIG. 1 being formed as a hexagonal hole, according to one embodiment of the present invention.

FIG. 35 is a schematic view illustrating the axial A-A cross section of the axial tubular flowpath (102) shown in FIG. 1 being formed as a hexagonal hole, according to one embodiment of the present invention;

As shown in FIG. 35, the main configuration is that the heat dissipater (101) with axial and radial air aperture is made of a material having good thermal conductivity, and between the radial air outlet hole near the connection side (104) and the air inlet port near the light projection side (103), the axial tubular flowpath (102) is served as a communicated tubular flowpath, wherein the A-A cross section of the tubular flowpath is in a hexagonal or hexagonal-like shape.

Figure 36:
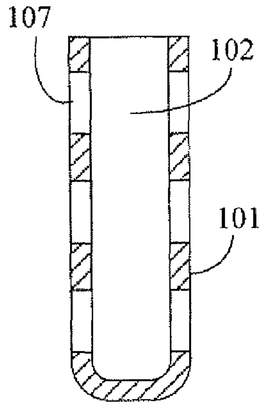
FIG. 36 is a schematic view illustrating the axial A-A cross section of the axial tubular flowpath (102) shown in FIG. 1 being formed as a U-shaped hole, according to one embodiment of the present invention.

FIG. 36 is a schematic view illustrating the axial A-A cross section of the axial tubular flowpath (102) shown in FIG. 1 being formed as a U-shaped hole, according to one embodiment of the present invention;

As shown in FIG. 36, the main configuration is that the heat dissipater (101) with axial and radial air aperture is made of a material having good thermal conductivity, and between the radial air outlet hole near the connection side (104) and the air inlet port near the light projection side (103), the axial tubular flowpath (102) is served as a communicated tubular flowpath, wherein the A-A cross section of the tubular flowpath is in a U shape with single sealed side.

Figure 37:
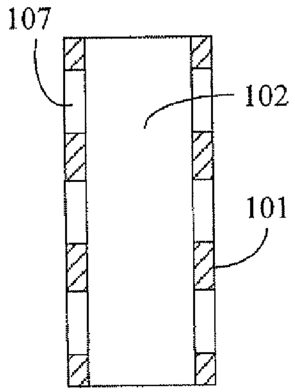
FIG. 37 is a schematic view illustrating the axial A-A cross section of the axial tubular flowpath (102) shown in FIG. 1 being formed as a singular-slot hole with dual open ends, according to one embodiment of the present invention.

FIG. 37 is a schematic view illustrating the axial A-A cross section of the axial tubular flowpath (102) shown in FIG. 1 being formed as a singular-slot hole with dual open ends, according to one embodiment of the present invention;

As shown in FIG. 37, the main configuration is that the heat dissipater (101) with axial and radial air aperture is made of a material having good thermal conductivity, and between the radial air outlet hole near the connection side (104) and the air inlet port near the light projection side (103), the axial tubular flowpath (102) is served as a communicated tubular flowpath, wherein the A-A cross section of the tubular flowpath is formed as a singular-slot hole with dual open ends.

Figure 38:
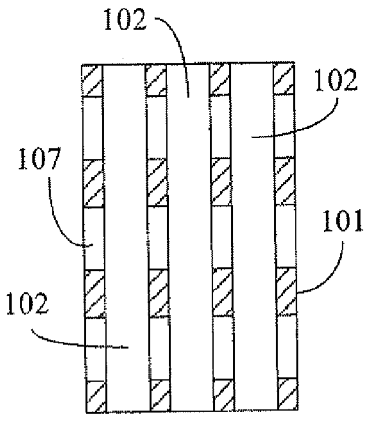
FIG. 38 is a schematic view illustrating the axial A-A cross section of the axial tubular flowpath (102) shown in FIG. 1 being formed as a multiple-slot hole with dual open ends, according to one embodiment of the present invention.

FIG. 38 is a schematic view illustrating the axial A-A cross section of the axial tubular flowpath (102) shown in FIG. 1 being formed as a multiple-slot hole with dual open ends, according to one embodiment of the present invention;

As shown in FIG. 38, the main configuration is that the heat dissipater (101) with axial and radial air aperture is made of a material having good thermal conductivity, and between the radial air outlet hole near the connection side (104) and the air inlet port near the light projection side (103), the axial tubular flowpath (102) is served as a communicated tubular flowpath, wherein the A-A cross section of the tubular flowpath is in formed as two or more than two slot hole with dual open ends.

Figure 39:
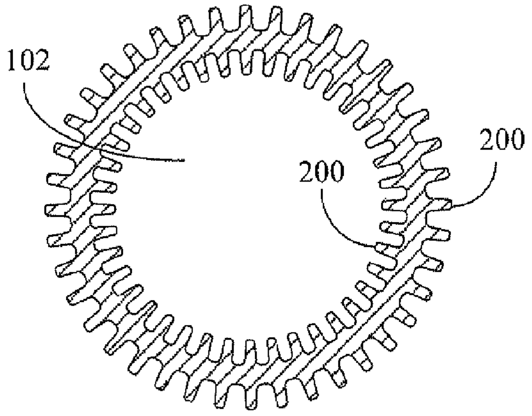
FIG. 39 is a schematic view illustrating the axial B-B cross section of the axial tubular flowpath (102) shown in FIG. 1 being formed as a heat dissipation fin structure (200), according to one embodiment of the present invention.

According to the heat dissipater with axial and radial air aperture and application device thereof, both or at least one of the interior and the exterior of the axial cross section of the axial tubular flowpath (102) can be provided with a heat dissipation fin structure (200) for increasing the heat dissipation effect;

FIG. 39 is a schematic view illustrating the axial B-B cross section of the axial tubular flowpath (102) shown in FIG. 1 being formed as a heat dissipation fin structure (200), according to one embodiment of the present invention;

As shown in FIG. 39, the main configuration is that the heat dissipater (101) with axial and radial air aperture is made of a material having good thermal conductivity, and between the radial air outlet hole near the connection side (104) and the air inlet port near the light projection side (103), the axial tubular flowpath (102) is served as a communicated tubular flowpath, wherein the B-B cross section of the tubular flowpath is formed with the heat dissipation fin structure (200).

Figure 40:
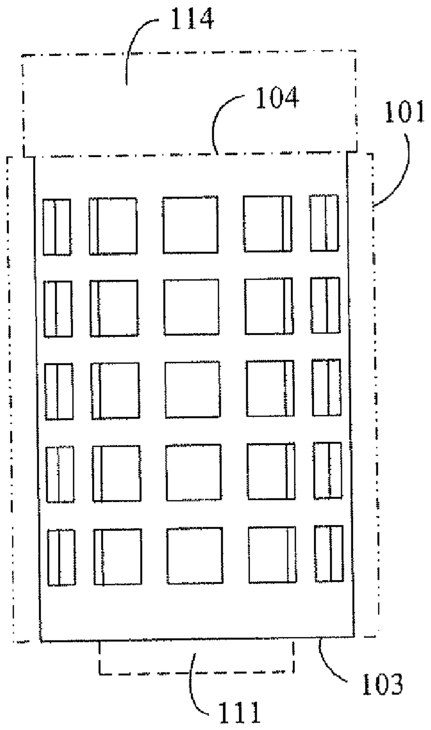
FIG. 40 is a schematic view showing the heat dissipater (101) with axial and radial air aperture being formed as a porous structure, according to one embodiment of the present invention.
Figure 41:
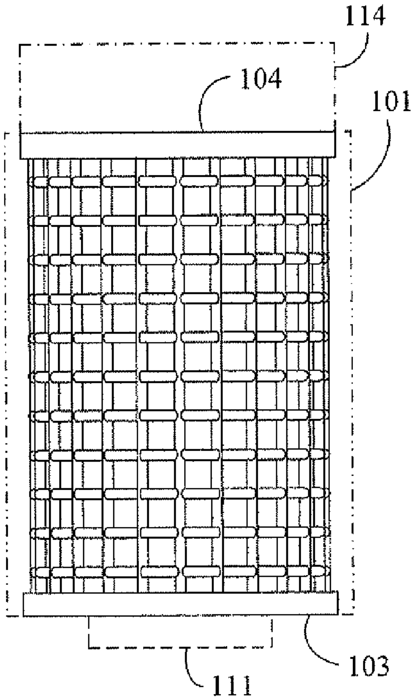
FIG. 41 is a schematic view showing the heat dissipater (101) with axial and radial air aperture being formed as a net-shaped structure, according to one embodiment of the present invention.

According to the heat dissipater with axial and radial air aperture and application device thereof, the heat dissipater (101) with axial and radial air aperture can be further formed as a porous or net-shaped structure which is made of a thermal conductive material, and the holes of the porous structure and the net holes of the net-shaped structure can be used for replacing the radial air outlet hole (107) and the radial air inlet port (108); and the light projection side (103) is formed with a block-shaped heat conductive structure allowing the electric luminous body to be installed thereon;

FIG. 40 is a schematic view showing the heat dissipater (101) with axial and radial air aperture being formed as a porous structure, according to one embodiment of the present invention;

As shown in FIG. 40, in the heat dissipater with axial and radial air aperture and application device thereof, the heat dissipater (101) with axial and radial air aperture can be further formed as a porous structure made of a thermal conductive material, and the holes of the porous structure can be used for replacing the radial air outlet hole (107) and the radial air inlet port (108); and the light projection side (103) is formed with a block-shaped heat conductive structure allowing the electric luminous body to be installed thereon;

FIG. 41 is a schematic view showing the heat dissipater (101) with axial and radial air aperture being formed as a net-shaped structure, according to one embodiment of the present invention;

As shown in FIG. 41, in the heat dissipater with axial and radial air aperture and application device thereof, the heat dissipater (101) with axial and radial air aperture can be further formed as a net-shaped structure made of a thermal conductive material, and the net holes of the net-shaped structure can be used for replacing the radial air outlet hole (107) and the radial air inlet port (108); and the light projection side (103) is formed with a block-shaped heat conductive structure allowing the electric luminous body to be installed thereon.

Figure 42:
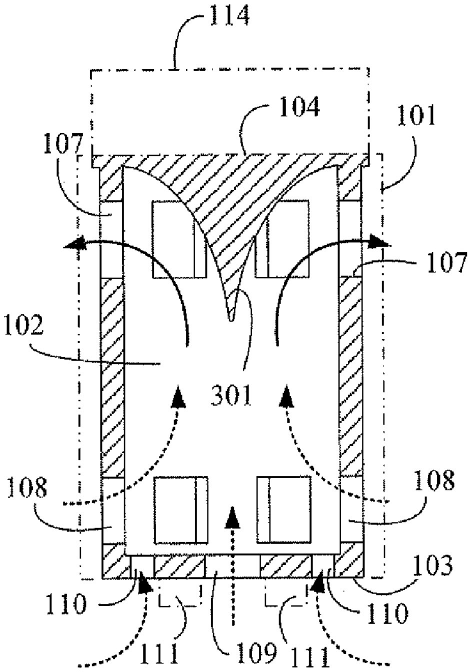
FIG. 42 is a schematic structural view illustrating a flow guide conical member (301) being formed at the inner top of the heat dissipater (101) with axial and radial air apertures and facing the axial direction of the light projection side (103), according to one embodiment of the present invention.
Figure 43:
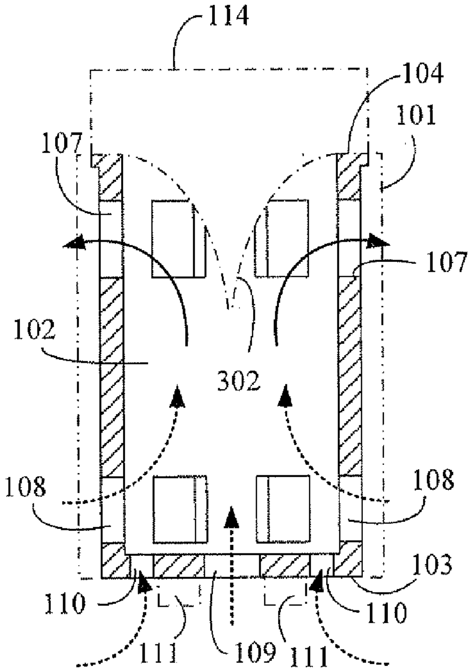
FIG. 43 is a schematic structural view illustrating a flow guide conical member (302) being formed on the side of the axially-fixed and electric-conductive interface (114) connected to the heat dissipater (101) with axial and radial air apertures and facing the axially direction of the light projection side (103) of the heat dissipater (101) with axial and radial air apertures, according to one embodiment of the present invention.

In the heat dissipater with axial and radial air aperture and application device thereofs, for facilitating the smoothness of the hot ascent/cold descent formed in the axial tubular flowpath (102), the inner top of the heat dissipater (101) with axial and radial air aperture is formed with a flow guide conical member (301) at the axial direction facing the light projection side (103); or formed with a flow guide conical member (302) along the axial direction facing the light projection side (103) of the heat dissipater (101) with axial and radial air aperture at the side of the axially-fixed and electric-conductive interface (114) for connecting to the heat dissipater (101) with axial and radial air aperture; the directions of said flow guide conical members (301), (302) facing the light projection side (103) of the heat dissipater (101) with axial and radial air aperture are formed in a conical shape for guiding the hot-ascended airflow in the axial tubular flowpath (102) to the radial air outlet hole (107); FIG. 42 is a schematic structural view illustrating the axial direction facing the light projection side (103) at the inner top of the heat dissipater (101) with axial and radial air aperture being formed with a flow guide conical member (301), according to one embodiment of the present invention;

As shown in FIG. 42, the inner top of the heat dissipater (101) with axial and radial air aperture disclosed in each embodiment is formed with a flow guide conical member (301) at the axial direction facing the light projection side (103), wherein the direction of said flow guide conical member (301) facing the light projection side (103) of the heat dissipater (101) with axial and radial air aperture is formed in a conical shape for guiding the hot-ascended airflow in the axial tubular flowpath (102) to the radial air outlet hole (107);

FIG. 43 is a schematic structural view illustrating that along the axial direction facing the light projection side (103) of the heat dissipater (101) with axial and radial air aperture at the side of the axially-fixed and electric-conductive interface (114) for connecting to the heat dissipater (101) with axial and radial air aperture being formed with a flow guide conical member (302), according to one embodiment of the present invention;

As shown in FIG. 43, for the axially-fixed and electric-conductive interface (114) disclosed in each embodiment of the present invention, along the axial direction facing the light projection side (103) of the heat dissipater (101) with axial and radial air aperture at the side of the axially-fixed and electric-conductive interface (114) for connecting to the heat dissipater (101) with axial and radial air aperture is formed with a flow guide conical member (302), wherein the direction of said flow guide conical member (302) facing the light projection side (103) of the heat dissipater (101) with axial and radial air aperture is formed in a conical shape for guiding the hot-ascended airflow in the axial tubular flowpath (102) to the radial air outlet hole (107).

Figure 44:
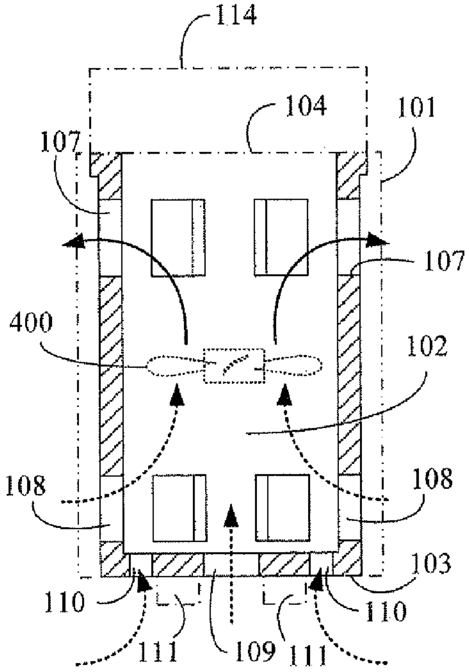
FIG. 44 is a schematic view illustrating an electric motor driven fan (400) being provided in the interior, according to one embodiment of the present invention.

According to the heat dissipater with axial and radial air aperture and application device thereof, the interior of the axial tubular flowpath (102) can be installed with an electric motor driven fan (400) for assisting the flowing of the hot airflow in the axial tubular flowpath (102) for increasing the heat dissipation effect;

FIG. 44 is a schematic view illustrating an electric motor driven fan (400) being provided in the interior, according to one embodiment of the present invention;

As shown in FIG. 44, in the heat dissipater with axial and radial air aperture and application device thereof, the airflow in the axial tubular flowpath (102) not only can be driven by the hot ascent/cool descent effect, but the electric motor driven fan (400) can also be further installed in the axial tubular flowpath (102) for assisting the flowing of the hot airflow in the axial tubular flowpath (102), and thereby increasing the heat dissipation effect.

The invention claimed is:

1. A heat dissipation assembly with axial and radial air apertures, comprising:

a heat dissipater (101) having axial and radial convection apertures, wherein:

said heat dissipater is thermally conductive, hollow, and has a first axial end and a second axial end, said heat dissipater includes an axial flowpath (102) that extends centrally through the heat dissipater, said first axial end is a light projection side (103) having an axial end surface on which a plurality of electric luminous bodies (111) are installed, said second axial end is a connection side (104), at least one of said convection apertures that is adjacent said connection end (104) is a radial air outlet port (107), the light projection side (103) includes a plurality of said convection apertures that serve as air inlet ports (109 and 110), said air inlet ports including at least one central air inlet port (109) that extends through a center of the axial end surface of the light projection side (103), and at least one peripheral air inlet port (110) extending through a periphery of the axial end surface of the light projection side (103), wherein said plurality of electric luminous bodies (111) installed on said axial end surface are annularly provided in at least one circle around the at least one central air inlet port (109) between said central air inlet port (109) and said at least one peripheral air inlet port (110), a light-pervious lampshade (113) is respectively provided for each said circle of electric luminous bodies (111), at least one of the respectively-provided light-pervious lampshades (113) covering the at least one circle of electric luminous bodies between the at least one central air inlet port (109) and the at least one peripheral air inlet port (110), heat generated by the plurality of electric luminous bodies (111) and transferred to the airflow on two sides of each of the plurality of electric luminous bodies (111) and two sides of the respectively-provided light-pervious lampshade (113) covering the at least one circle of electric luminous bodies (111) causes convection and a resulting airflow, said airflow entering the heat dissipater through both the central and peripheral air inlet ports that extend through said axial end surface before passing through the axial flow path (102) and exiting the heat dissipater through the radial air outlet aperture (107), and the thermal energy of said airflow transferred from the heat at the two sides of the plurality of electric luminous bodies (111) and respectively-provided light-pervious lampshade (113) covering the at least one circle of electric luminous bodies (111) is discharged to an exterior of the heat dissipation assembly by heat transfer between internal and external heat dissipation surfaces (106,105), and by said airflow that enters the heat dissipater through both the central and peripheral air inlet ports, passes along said axial airflow path extending centrally through the heat dissipater, and exits the heat dissipater through said at least one radial air outlet port (107).

2. A heat dissipation assembly as claimed in claim 1, wherein the electric luminous body is an LED (111).

3. A heat dissipation assembly as claimed in claim 1, further comprising:

an electrically conductive interface (114, 115) electrically connected to the plurality of electric luminous bodies (111) and situated on the connection side (104) of the heat dissipater, said electrically-conductive interface (114, 115) including at least one of an electrically conductive terminal structure, a screw-in connector structure, an insertion-type connector structure, a lock-on connector structure, and a lamp-holder structure for supplying electrical power from an external power source to the plurality of electric luminous bodies (111).

4. A heat dissipation assembly as claimed in claim 3, further comprising a top cover member (116), wherein the top cover member (116) is a thermally-insulating member that protects and thermally insulates the heat dissipater.

5. A heat dissipation assembly as claimed in claim 3, wherein the top cover member (116) is arranged to have at least one functions of condensing, diffusing, refracting, and reflecting optical energy emitted by the electric luminous body (111).

6. A heat dissipation assembly as claimed in claim 1, further comprising:

a secondary optical device (112) arranged to have at least one functions of condensing, diffusing, refracting, and reflecting optical energy emitted by the electric luminous body (111);

and an axially-fixed and electrically-conductive interface (114) electrically connected to the plurality of electric luminous bodies (111) and situated on the connection side (104) of the heat dissipater, said interface (114) including at least one of an electrically conductive terminal structure, a screw-in connector structure, an insertion-type connector structure, a lock-on connector structure, and a lamp-holder structure for supplying electrical power from an external power source to the plurality of electric luminous bodies (111).

7. A heat dissipation assembly as claimed in claim 6, wherein the plurality of electric luminous bodies (111) include electric luminous bodies installed near an outer periphery of the light projection side (103).

8. A heat dissipation assembly as claimed in claim 6, wherein said central air inlet port (109) forms an inner periphery of the light projection side (103), and the plurality of electric luminous bodies (111) include electric luminous bodies installed near said inner periphery of the light projection side (103).

9. A heat dissipation assembly as claimed in claim 6, wherein additional air inlet ports (110) are annularly arranged to be adjacent and between said plurality of electric luminous bodies (111).

10. A heat dissipation assembly as claimed in claim 1, wherein the plurality of electric luminous bodies (111) include electric luminous bodies installed near an outer periphery of the light projection side (103).

11. A heat dissipation assembly as claimed in claim 1, wherein said axial central air inlet port (109) forms an inner periphery of the light projection side (103), and the plurality of electric luminous bodies (111) include electric luminous bodies installed near said inner periphery of the light projection side (103).

12. A heat dissipation assembly as claimed in claim 1, wherein additional air inlet ports (110) are annularly arranged to be adjacent and between said plurality of electric luminous bodies (111) and additional electric luminous bodies (111) annularly installed in a circular manner at the outer periphery of the axial end surface of the projection side (103).

13. A heat dissipation assembly as claimed in claim 1, wherein said axial flowpath (102) has a cross-section transverse to an axial direction of the heat dissipater, said cross-section having one of a round, oval, triangular, rectangular, pentagonal, hexangular, polygonal, and U shape.

14. A heat dissipation assembly as claimed in claim 1, wherein at least one of the external heat dissipation surface (105) and an internal heat dissipation surface (106) includes a fin structure (200) extending therefrom to enhance heat dissipation.

15. A heat dissipation assembly as claimed in claim 1, wherein said convection apertures are formed by a porous or net-shaped structure of said heat dissipater, said light projection side (103) including a block-shaped heat conductive structure on which the electric luminous body (111) is installed.

16. A heat dissipation assembly as claimed in claim 1, further comprising an electric motor driven fan (400) installed in said axial flowpath (102) for enhancing heat dissipation.

17. A heat dissipation assembly as claimed in claim 1, wherein said heat dissipater has one of a cylindrical shape and a frustoconical shape.

* * * * *